US012614018B2

(12) United States Patent
Saha et al.

(10) Patent No.: US 12,614,018 B2
(45) Date of Patent: Apr. 28, 2026

(54) METHODS AND APPARATUS TO IMPLEMENT LIBRARY ANALYTICS AND GUIDED PARTITIONING TO SELECT POWER-PERFORMANCE-AREA OF SEMICONDUCTOR CHIP DESIGN

(71) Applicant: Intel Corporation, Santa Clara, CA (US)

(72) Inventors: Sourav Saha, Bangalore (IN); Praveen Ghagare, Bidar (IN); Divya M, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 578 days.

(21) Appl. No.: 17/978,043

(22) Filed: Oct. 31, 2022

(65) Prior Publication Data

US 2024/0143892 A1 May 2, 2024

(51) Int. Cl.
*G06F 30/398* (2020.01)
*G06F 30/373* (2020.01)
(52) U.S. Cl.
CPC .......... *G06F 30/398* (2020.01); *G06F 30/373* (2020.01)

(58) Field of Classification Search
USPC ........................ 716/103, 104, 106, 111, 116
See application file for complete search history.

(56) References Cited

U.S. PATENT DOCUMENTS

| | | | |
|---|---|---|---|
| 7,469,394 B1 * | 12/2008 | Hutton | G06F 8/41 |
| | | | 716/113 |
| 10,699,053 B1 * | 6/2020 | Wang | G06F 30/34 |
| 2010/0146338 A1 * | 6/2010 | Schalick | G06F 11/3698 |
| | | | 714/E11.002 |
| 2017/0124235 A1 * | 5/2017 | Ferguson | G06F 30/30 |

* cited by examiner

*Primary Examiner* — Brian Ngo
(74) *Attorney, Agent, or Firm* — Hanley, Flight & Zimmerman, LLC

(57) ABSTRACT

Methods, apparatus, systems, and articles of manufacture are disclosed. In one example, the apparatus includes memory, instructions, and processor circuitry to instantiate or execute the machine readable instructions to determine a design block associated with a design exception, parse the design block into a functional netlist of cell families, generate a cell occurrence counts distribution, and group cell families into cell family bins corresponding to fabrication parameters. The processor circuitry further determines inclusion of a first cell family bin does not improve one or more process technology attribute values and causes a user interface to indicate the first cell family bin as a cell family bin candidate for removal from the functional netlist.

30 Claims, 17 Drawing Sheets

600A

602

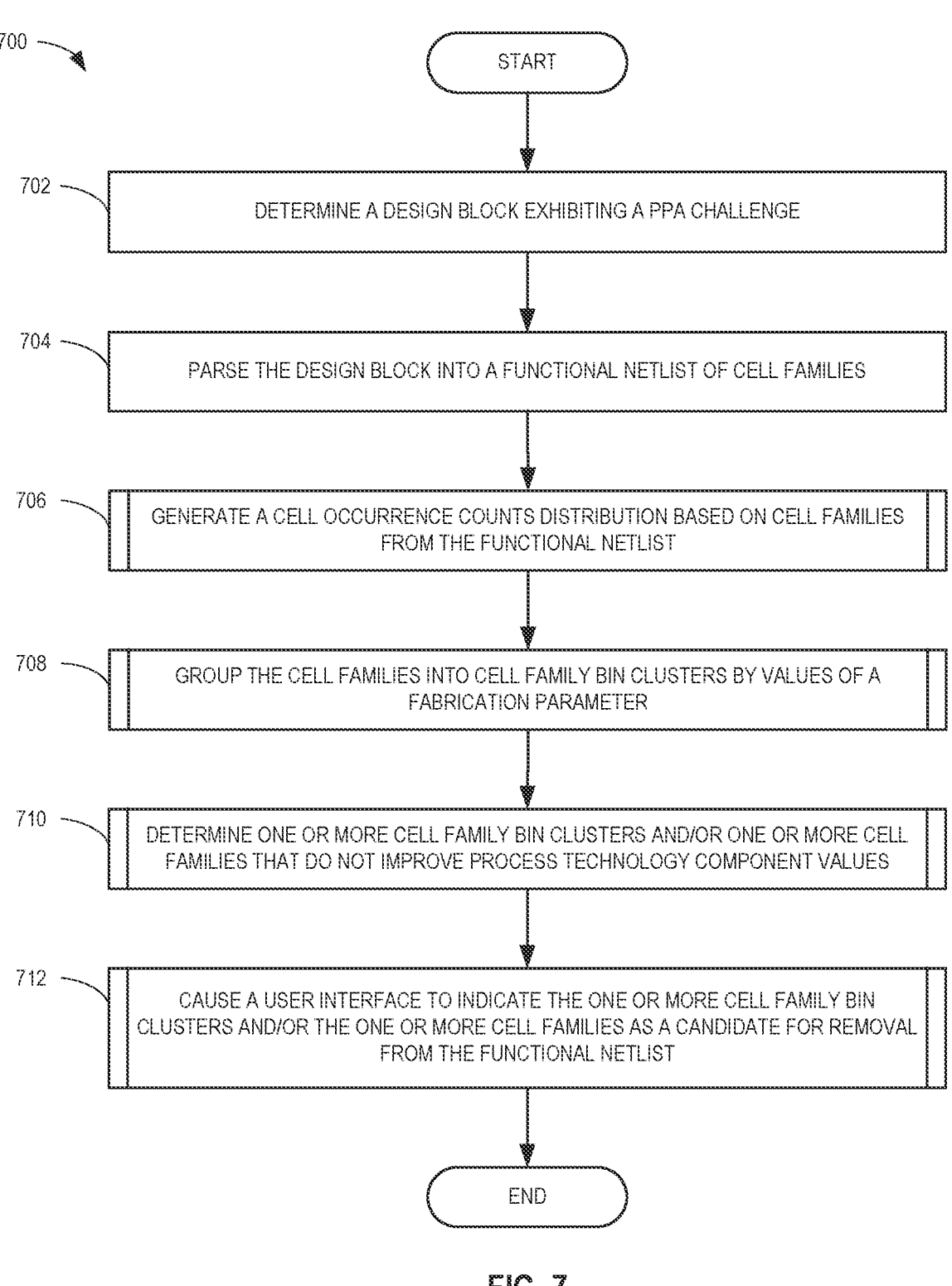

700

START

702 — DETERMINE A DESIGN BLOCK EXHIBITING A PPA CHALLENGE

704 — PARSE THE DESIGN BLOCK INTO A FUNCTIONAL NETLIST OF CELL FAMILIES

706 — GENERATE A CELL OCCURRENCE COUNTS DISTRIBUTION BASED ON CELL FAMILIES FROM THE FUNCTIONAL NETLIST

708 — GROUP THE CELL FAMILIES INTO CELL FAMILY BIN CLUSTERS BY VALUES OF A FABRICATION PARAMETER

710 — DETERMINE ONE OR MORE CELL FAMILY BIN CLUSTERS AND/OR ONE OR MORE CELL FAMILIES THAT DO NOT IMPROVE PROCESS TECHNOLOGY COMPONENT VALUES

712 — CAUSE A USER INTERFACE TO INDICATE THE ONE OR MORE CELL FAMILY BIN CLUSTERS AND/OR THE ONE OR MORE CELL FAMILIES AS A CANDIDATE FOR REMOVAL FROM THE FUNCTIONAL NETLIST

END

FIG. 7

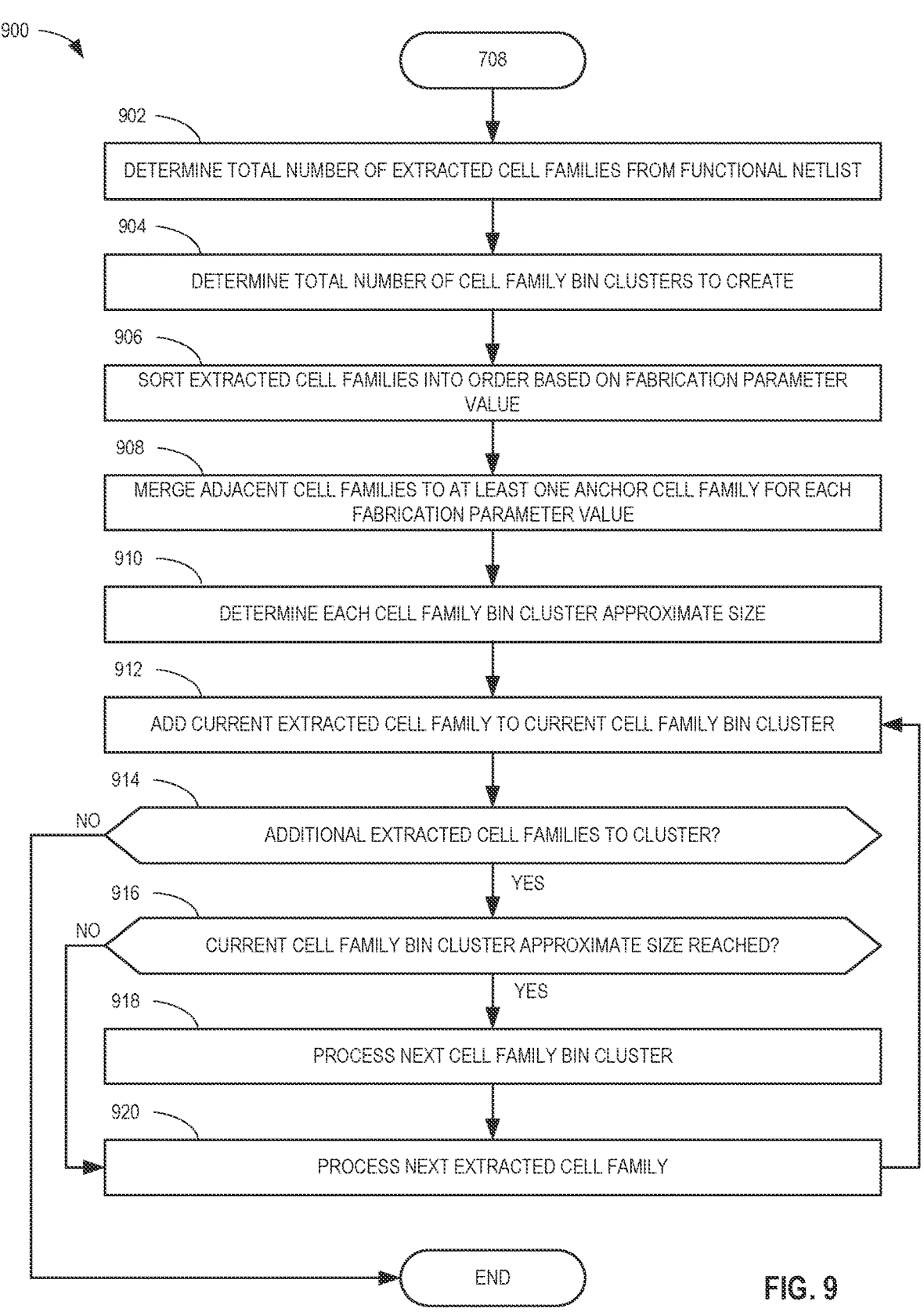

900

708

902 — DETERMINE TOTAL NUMBER OF EXTRACTED CELL FAMILIES FROM FUNCTIONAL NETLIST

904 — DETERMINE TOTAL NUMBER OF CELL FAMILY BIN CLUSTERS TO CREATE

906 — SORT EXTRACTED CELL FAMILIES INTO ORDER BASED ON FABRICATION PARAMETER VALUE

908 — MERGE ADJACENT CELL FAMILIES TO AT LEAST ONE ANCHOR CELL FAMILY FOR EACH FABRICATION PARAMETER VALUE

910 — DETERMINE EACH CELL FAMILY BIN CLUSTER APPROXIMATE SIZE

912 — ADD CURRENT EXTRACTED CELL FAMILY TO CURRENT CELL FAMILY BIN CLUSTER

914 — ADDITIONAL EXTRACTED CELL FAMILIES TO CLUSTER?    NO    YES

916 — CURRENT CELL FAMILY BIN CLUSTER APPROXIMATE SIZE REACHED?    NO    YES

918 — PROCESS NEXT CELL FAMILY BIN CLUSTER

920 — PROCESS NEXT EXTRACTED CELL FAMILY

END

FIG. 9

METHODS AND APPARATUS TO IMPLEMENT LIBRARY ANALYTICS AND GUIDED PARTITIONING TO SELECT POWER-PERFORMANCE-AREA OF SEMICONDUCTOR CHIP DESIGN

FIELD OF THE DISCLOSURE

This disclosure relates generally to designing layouts of semiconductor chips and, more particularly, to implementing library analytics and guided partitioning to select power-performance-area of semiconductor chip design.

BACKGROUND

Semiconductor design implementation relies on the composition of standard cell libraries and the selection of cells in technology mapping computer aided design (CAD) engines. The process to design efficient system-on-chip (SoC) layouts optimizes three factors, the power, performance, and area (PPA) of the blocks of cells that make up the SoC.

BRIEF DESCRIPTION OF THE DRAWINGS

FIG. 7 is a flowchart representative of example machine readable instructions and/or example operations that may be executed and/or instantiated by processor circuitry to implement the cell library analytics circuitry of FIGS. 1 and 2 to perform library analytics and guided partitioning for efficient PPA of semiconductor chip design.

FIG. 9 is a flowchart representative of example machine readable instructions and/or example operations that may be executed and/or instantiated by processor circuitry to implement the cell library analytics circuitry of FIGS. 1 and 2 to group extracted cell families into cell family bins.

Figure 1:
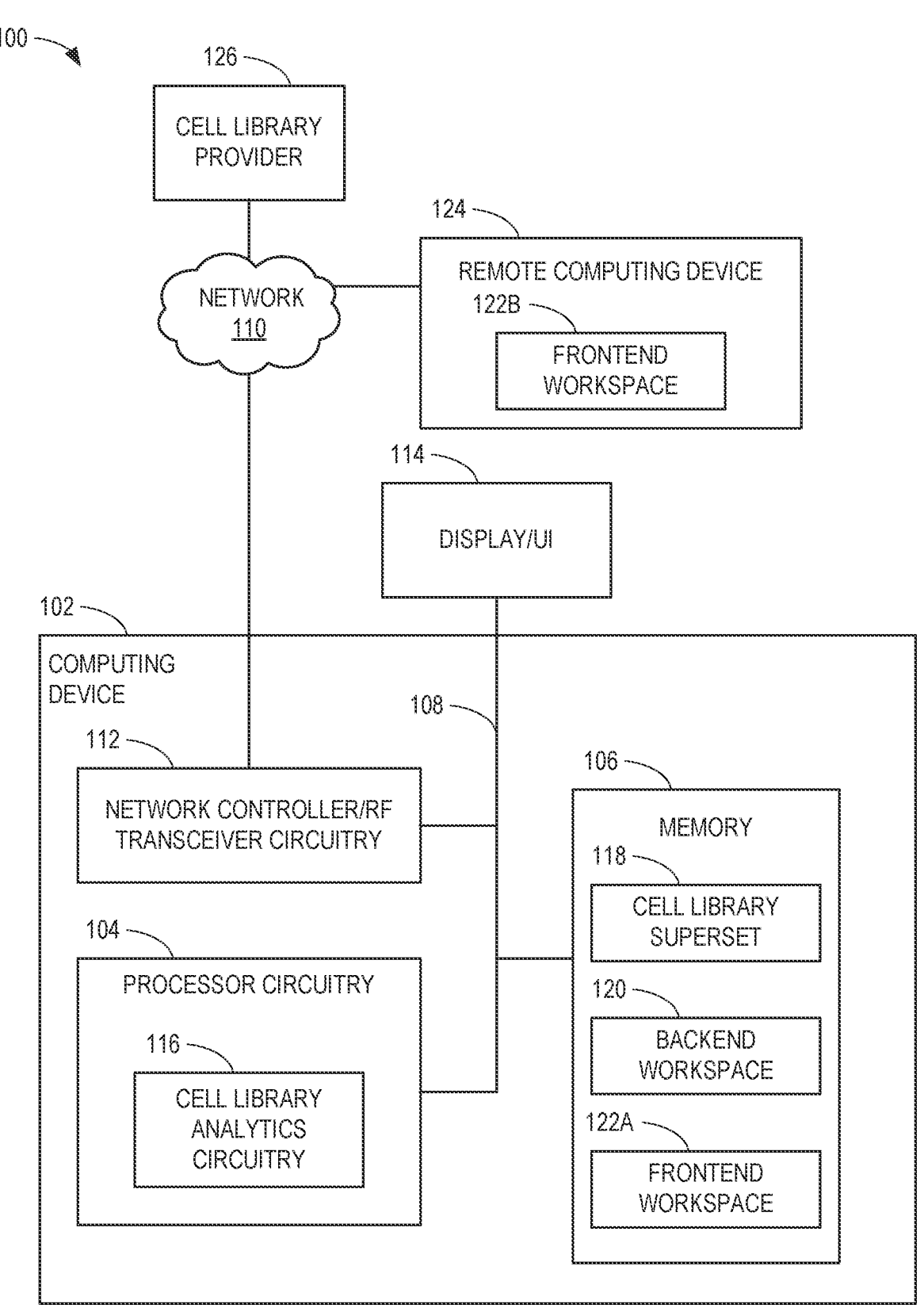
FIG. 1 is an illustration of an example computing system to implement library analytics and guided partitioning for efficient power, performance, and area of semiconductor chip design.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real-world delays for computing time, transmission, etc. Thus, unless otherwise specified, "substantially real time" refers to being within a one-second time frame of real time.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

In examples of digital circuit design, logic that determines the layout of functional aspects of a hardware circuit will run one or more complex algorithms that convert RTL (register-transfer level) code to such circuits. In some examples, the algorithms attempt to maximize power, performance, and area (PPA) factors when developing the layout of the circuit. For example, the power of a circuit means the power consumption (e.g., electrical power draw) of the circuit when operational (e.g., lower power is better), the performance of a circuit means the speed with which the circuit operates (e.g., faster performance is better), and the area of a circuit means the X, Y size (e.g., length and width dimensions) of a circuit (e.g., smaller area is better). A cell library is input into the algorithm, and the output is a proposed layout of the circuit, cell by cell. The example circuit has a baseline PPA, which is used to measure circuit design optimizations against. As used herein, baseline PPA means the resulting power, performance (e.g., speed), and area of a circuit layout when the algorithm is provided the full cell library as input. In other words, in some examples, the circuit generated by the algorithm exhibits a baseline PPA when the algorithm has every type of cell in the library from which to select, test, and potentially utilize. In examples disclosed herein, the power consumption, speed performance, and area are referred to as "PPA factors" and also "process technology attributes." In examples disclosed herein, the values quantifying the process technology attributes are referred to as "process technology attribute values" or "PPA factor values." For example, a power consumption process technology attribute value may be 15 Watts of peak power consumption. An example speed performance process technology attribute value may be 3.5 GHz of peak speed of the cells in the design block. For example, an area process technology attribute value may be $125\mu^2$ in physical area footprint.

As used herein, a cell library is a collection of low-level electronic logic functions (e.g., cells), such as AND, OR, NAND, XOR, etc. combinatorial cells, as well as latch and flip-flop sequential cells. In some examples, within a cell library, there may be approximately 50-150 unique functions (e.g., an AND gate may be considered a function). In some examples, each type of function may have multiple different implementations/varieties (e.g., flavors) of each function type. In some examples, a cell library (e.g., a cell library superset) may include 10,000 or more individual cells, which may include many different implementations of a given cell type. For example, there may be 65 implementations of NAND cells. Each of the 65 different NAND cell implementations may have some level of different physical geometry and/or different fabrication parameters (e.g., a threshold voltage (VT) parameter, a drive strength parameter, etc.) to influence different aspects of the PPA factors. For example, some of the 65 cell implementations may be designed to influence the power factor of PPA, others may be designed to influence the performance factor of PPA, and others may be designed to influence the area factor of PPA. Furthermore, some cell implementations may be designed to influence two of the PPA factors, and yet other cell implementations may be designed to influence all three PPA factors. In some examples, there are tradeoffs when selecting PPA factors to influence. For example, a cell implementation designed to influence the performance factor of PPA (e.g., the cell operates faster), may also cause higher power consumption during operation (e.g., the cell consumes more power during operation).

Examples disclosed herein implement library analytics and guided partitioning to select power, performance and area of semiconductor chip design. In some examples, techniques disclosed herein may be used to select chip designs that are more efficient in power, performance, and area than other chip designs. Disclosed examples determine when a design block within an SoC exhibits a PPA challenge. In examples disclosed herein, a PPA challenge refers to the design block exhibiting a design exception (e.g., an unsatisfactory result), which may be a higher than average power consumption, a lower than average execution speed (e.g., speed performance), and/or a larger than average area footprint after circuit design automation software has placed and routed the design block. In examples disclosed herein, a design block is a combination of cells arranged in circuit and/or configured to implement an operation, function, or task. In examples disclosed herein, placing and routing a design block refers to the process of arranging/placing cells and routing traces between the cells to generate a functional circuit to perform the RTL description. Physical placements of cells in a die and the number and/or lengths of traces between the cells affects the amount of physical space (e.g., physical area) occupied by the cells on the die. Examples disclosed herein parse a design block to create a functional netlist that provides RTL descriptions of the cells within the design block. Examples disclosed herein extract cell families from the created functional netlist in a dominant order. For example, cell families that are most prevalent within the design block (e.g., have the highest occurrence counts within the design block) will be extracted. Examples disclosed herein stop extracting cell families once a threshold cumulative percentage of total cell families in the netlist is satisfied.

Examples disclosed herein group extracted cell families into cell family bins. In some examples, the cell family bins are grouped based on the values of a fabrication parameter. For example, a fabrication parameter may be drive strength and cell families may be grouped into cell family bins based on whether their drive strength values are equal or similar. Examples disclosed herein determine when cell family bins do not improve PPA factors. For example, no improvement of PPA factors include power consumption not being reduced, performance not improving, and area not made any smaller with the implementation of the cell family in a current analysis. Examples disclosed herein cause a user interface to highlight the cell family bin for removal from the functional netlist when no improvement of PPA factor values are determined.

FIG. 1 is an illustration of an example computing system 100 to implement library analytics and guided partitioning for efficient power, performance, and area of semiconductor chip design. In the illustrated example of FIG. 1, a computing device 102 is shown. The example computing device 102 may be a laptop computer, a desktop computer, a workstation, a server, or any other type of computing device that can execute software code. The example computing device 102 includes processor circuitry 104, which may be the same as, similar to, different from, or complementary to processor circuitry 1212 in FIG. 12. In some examples, the processor circuitry 104 is communicatively coupled to a memory 106 over an interface 108. The example interface 108 includes interface circuitry to communicatively couple the processor circuitry 104 and the memory 106. The example memory 106 may include dynamic random access memory (DRAM), static random access memory (SRAM), a cache memory, a buffer, non-volatile memory, a storage device, or any one or more other forms of memory that provide data storage. The example interface 108 may include one or more types of interfaces implemented by hardware in accordance with one or more interface standards, such as IEEE (Institute of Electrical and Electronics Engineers) or JEDEC (Joint Electron Device Engineering Council) high speed memory interfaces, a Peripheral Component Interconnect Express (PCIe) interface, or any other interface capable of sending and receiving data between a processor circuitry 104 and a memory 106.

The example computing device 102 is additionally communicatively coupled to a network 110 (e.g., a cloud network) through a network controller and/or RF transceiver circuitry 112. The example network 110 may be any type of network capable of carrying one or more types of network packets between nodes on the network 110, such as computing device 102 and or any one or more other computing devices, switches, gateways, servers, and/or other end points across the network 108. The example network controller/RF transceiver circuitry 112 translates information from the interface 108 to data packets corresponding one or more network protocols, allowing data to be sent from the computing device 102 across the network 110 as well as data to be received by the computing device 102 from the network 110. In some examples, the processor circuitry 104 is communicatively coupled to the network 110 through the interface 108 and additionally through the network controller and/or RF transceiver circuitry 112 that is also communicatively coupled to the interface 108.

The example computing device 102 is additionally communicatively coupled to a display/user interface (UI) 114. In some examples, the display/UI 114 displays data from the computing device 102 to a user. In some examples, the displayed data is received from processor circuitry 104 and/or from other circuitry within the computing device 102.

In some examples, the processor circuitry 104 includes cell library analytics circuitry 116 to implement library analytics and guided partitioning for efficient power, performance, and area of semiconductor chip design. In some examples, the library analytics and guided partitioning are implemented on a cell library superset 118 that may be stored in the memory 106. In some examples, the computing device 102 receives/obtains a cell library superset 118 from the network 108 and stores the cell library superset 118 in the memory 104 to be analyzed. In some examples, a cell library backend workspace 120 is also present in the memory 106. The example cell library analytics circuitry 116 employs the backend workspace 120 for a circuit designer test runs and circuit design automation algorithms that perform PPA analysis on potential design block layouts. In some examples, the circuit design automation algorithms perform simulations and analysis on iterations of design block layouts to determine power consumption, performance, and area factors for consideration of cell selection in a design block. As described herein, a design block means a portion of the circuit design layout of an SoC (e.g., an area of the SoC that may perform a set of related functions). In some examples, there may be thousands of cells in a design block and they may be related to 50-150 or more cell families.

In the illustrated example of FIG. 1, a front end workspace 122A is present in the memory 106. In such examples, a circuit designer may use a UI, such as display/UI 114, to view PPA analysis in the frontend workspace 122A. In some examples, the PPA analysis may be received from the backend workspace 120. As illustrated in FIG. 1, in some examples, the frontend workspace 122A is located locally in computing device 102. However, in some examples, the frontend workspace 122B is located on a remote computing device 124. For example, the remote computing device 124 may be a circuit designer's personal computer with a web interface that allows a display of PPA analysis from the computing device 102, via the network 110, as well as user inputs transmitted from the remote computing device 124 to the computing device 102 via the network 110. In some examples, the cell library superset 118 is provided by a cell library provider 126, via the network 110. However, in some examples, the cell library superset 118 is a native cell library to the computing device 102 that hosts the backend workspace 120 and the cell library superset 118 does not need to be obtained from a third-party cell library provider 126.

Figure 2:
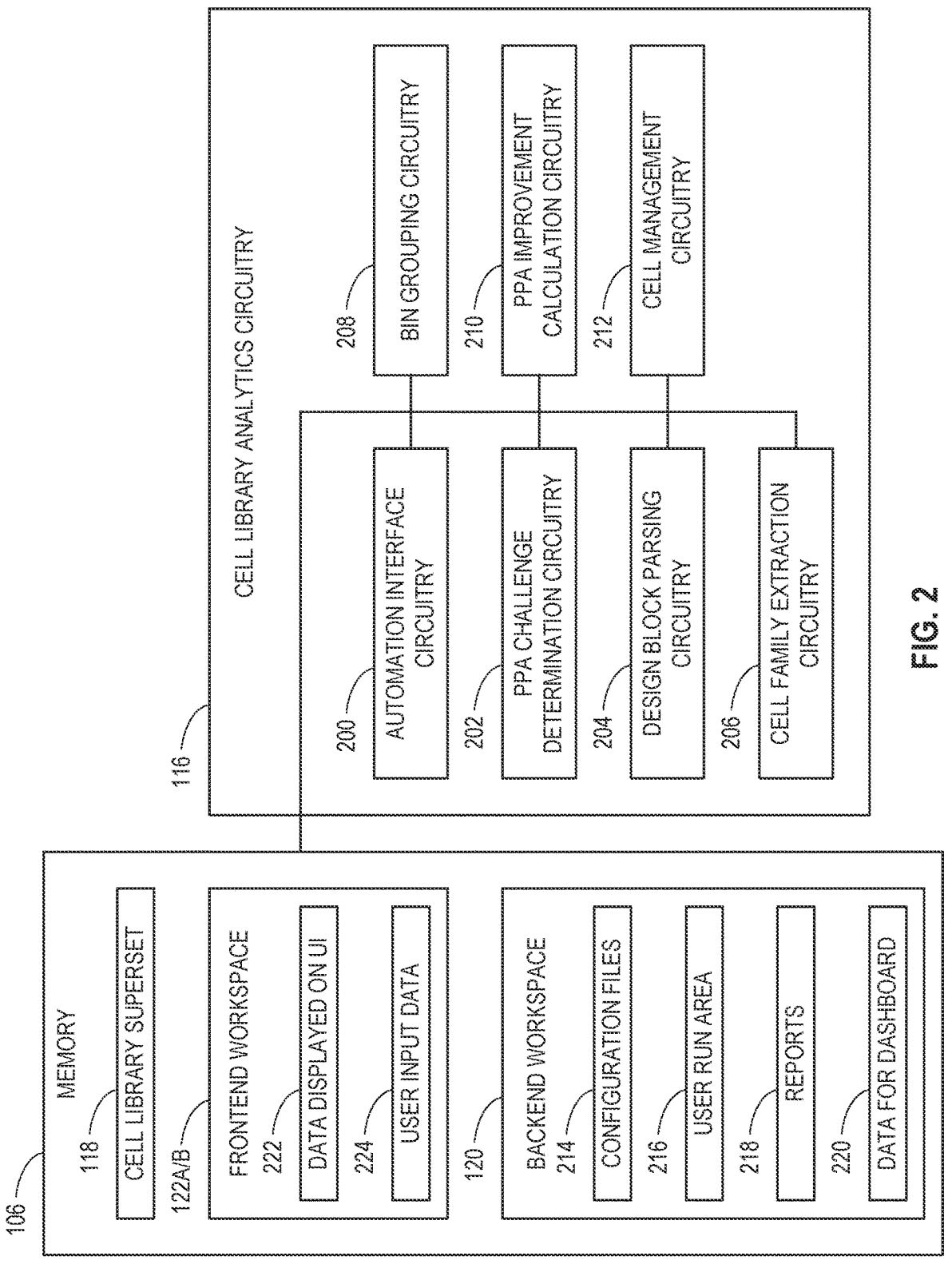
FIG. 2 is a block diagram of the example cell library analytics circuitry of FIG. 1 to implement library analytics and guided partitioning for efficient power, performance, and area of semiconductor chip design.

FIG. 2 is a block diagram of the example cell library analytics circuitry 116 (FIG. 1) to implement library analytics and guided partitioning for efficient power, performance, and area of semiconductor chip design. The example cell library analytics circuitry 116 of FIG. 2 may be instantiated (e.g., creating an instance of, bring into being for any length of time, materialize, implement, etc.) by processor circuitry such as a central processing unit executing instructions. Additionally or alternatively, example cell library analytics circuitry 116 of FIG. 2 may be instantiated (e.g., creating an instance of, bring into being for any length of time, materialize, implement, etc.) by an ASIC or an FPGA structured to perform operations corresponding to the instructions. It should be understood that some or all of the circuitry of FIG. 2 may, thus, be instantiated at the same or different times. Some or all of the circuitry may be instantiated, for example, in one or more threads executing concurrently on hardware and/or in series on hardware. Moreover, in some examples, some or all of the circuitry of FIG. 2 may be implemented by one or more virtual machines and/or containers executing on the microprocessor.

As illustrated in FIG. 2, the cell library analytics circuitry 116 includes automation interface circuitry 200, PPA challenge determination circuitry 202, design block parsing circuitry 204, cell family extraction circuitry 206, bin grouping circuitry 208, PPA improvement calculation circuitry 210, and cell management circuitry 212. Additionally, in some examples, the cell library analytics circuitry 116 is in circuit with memory 106 (FIG. 1). In some examples, memory space is allocated in the memory 106 to store the cell library superset 118 (FIG. 1), the backend workspace 120 (FIG. 1), and the frontend workspace 122A/B (FIG. 1). In some examples, the backend workspace includes configuration files 214, a user run area 216, reports 218, and data for dashboard 220. In some examples, the frontend workspace 122A/B includes data displayed on the UI 222 and user input data 224.

Figure 3:
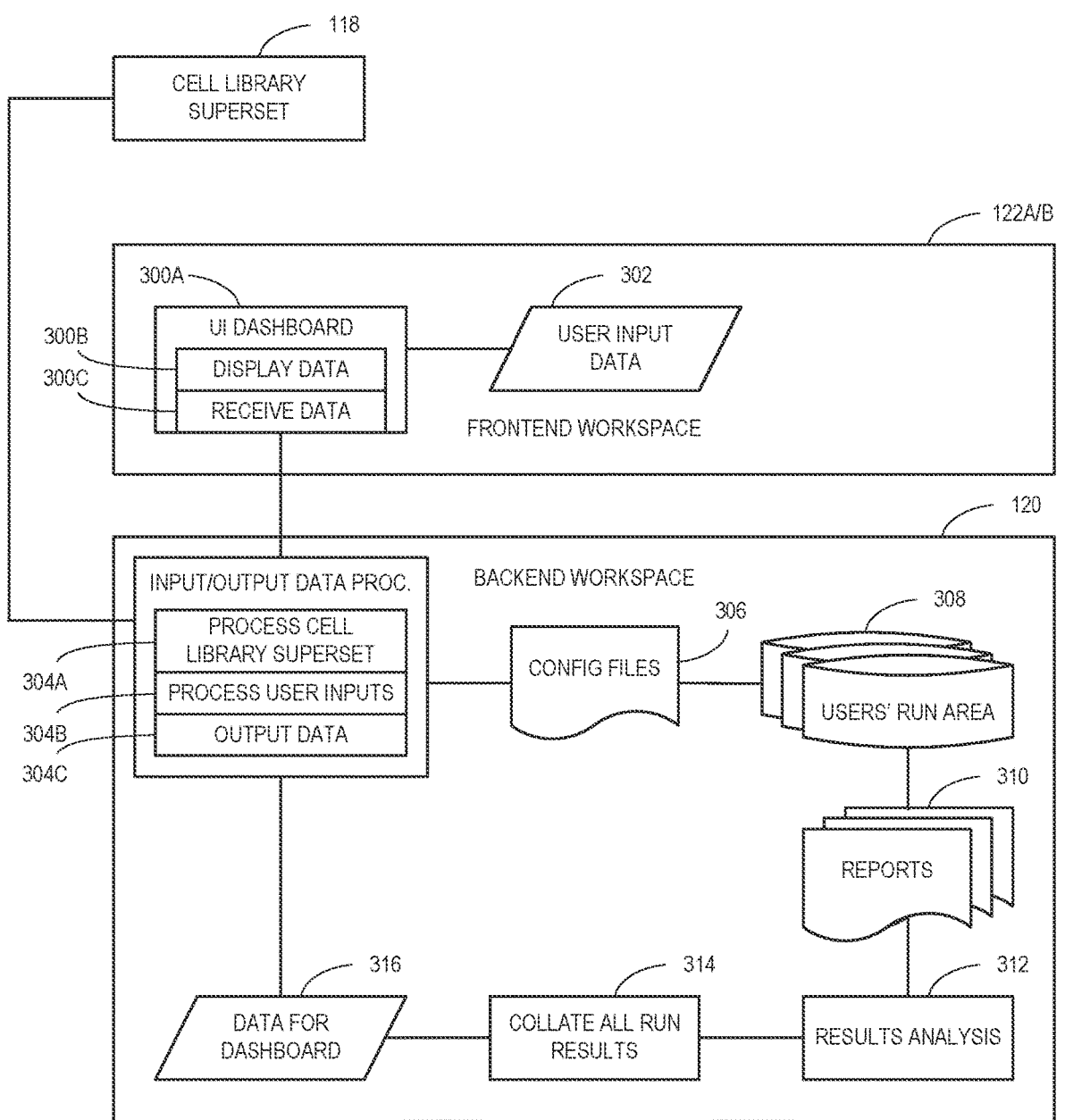
FIG. 3 illustrates a process flow of work performed by the cell library analytics circuitry of FIGS. 1 and 2 and the interaction between the backend workspace and the frontend workspace of FIGS. 1 and 2.

A detailed process flow of work performed by the cell library analytics circuitry 116 and the interaction between the backend workspace 120 and the frontend workspace 122A/B is illustrated in FIG. 3.

In the illustrated example of FIG. 2, the cell library analytics circuitry 116 includes automation interface circuitry 200. Turning to FIG. 3, the example automation interface circuitry 200 (FIG. 2) causes a UI dashboard at the frontend workspace 122A/B to display data (process flow 300B) to a circuit designer/user and receive data (process flow 300C) from the circuitry designer/user. In some examples, the data received from the circuit designer/user is user input data 302. The example automation interface circuitry 200 causes logic in the frontend workspace 122A/B, such as the UI dashboard, to send the obtained user inputs (e.g., user input data 302) to the backend workspace 120 (FIG. 1) for processing. In some examples, the data displayed to the circuit designer/user is obtained from the backend workspace 120. The data that is displayed is described in greater detail below in connection with FIG. 6.

The example automation interface circuitry 200 manages input/output data processing to and from the backend workspace 120. For example, the automation interface circuitry 200 processes a cell library superset 118 (process flow 304A). In some examples, the cell library superset 118 is obtained, via the network 110, from a cell library provider 126 (FIG. 1). In some examples, to process a cell library superset 118 means to obtain the cell library superset 118 from a cell library provider 126 and integrate the library into the backend workspace 120. In this manner, the cell library superset 118 can be used by circuit design and simulation algorithms to implement cells defined in the cell library superset 118. Such cells can be used in a design block being simulated on one or more workloads.

The example automation interface circuitry 200 also processes user inputs (process flow 304B) obtained from the UI dashboard (e.g., received from the user input data 302). In some examples, at least some of the information from the user input data obtained from process flow 304B and/or the cell library superset 118 data obtained from process flow 304A are processed and converted into configuration files 306 provided to the users' run area 308. In some examples, the users' run area 308 includes design blocks that either use the standard library of cells from the cell library superset 118 or use a custom library of cells that may include a subset of the cell library superset 118. Each design block is then tested for PPA factors by running one or more design block simulation algorithms, and reports 310 are generated. In some examples, any known algorithm may be used that is capable of testing design blocks to obtain PPA factor information. Thus, in some examples, the reports 310 include cell power consumption, cell performance, and the area for each cell. In some examples, the reports 310 also include data related to one or more fabrication parameter values for each cell utilized. For example, a drive strength fabrication parameter value may indicate the drive strength of each cell included in the reports 310. As described herein, drive strength is a measure of how much electrical load a standard cell can drive. For example, a larger drive strength means that the standard cell can sink a larger amount of electrical current to drive a larger electrical load. However, a smaller drive strength means the standard cell is capable of sinking less electrical current and, thus, capable of driving a smaller electrical load. Electrical load of a circuit increases as the number of transistors or other circuit components increases in that circuit. Electrical load can also increase in circuitry when a higher power-consuming component is added to the circuit. In some examples, other fabrication parameters may be included instead of or in addition to drive strength, such as threshold voltage or cell topology, among others.

In the illustrated example in FIG. 3, the algorithm(s) running the tests in the users' run area 308 sends the reports 310 into a results analysis process (process flow block 312). The results analysis 312 portion of the process flow is described in greater detail below. Then, in some examples, the analyzed results are collated 314 across all runs/tests and then provided as data for the dashboard 316.

The example automation interface circuitry 200 also processes output data (e.g., data for dashboard 316) that is to be sent to the UI dashboard in the frontend workspace 122A/B for display to the circuit designer/user. Such output data is described as data for dashboard 316 and includes a set of collated results 314 from all simulation runs by one or more algorithms that determine PPA factors for design blocks (e.g., different combinations of cells) by simulating assembled design blocks running workloads.

Figure 11:
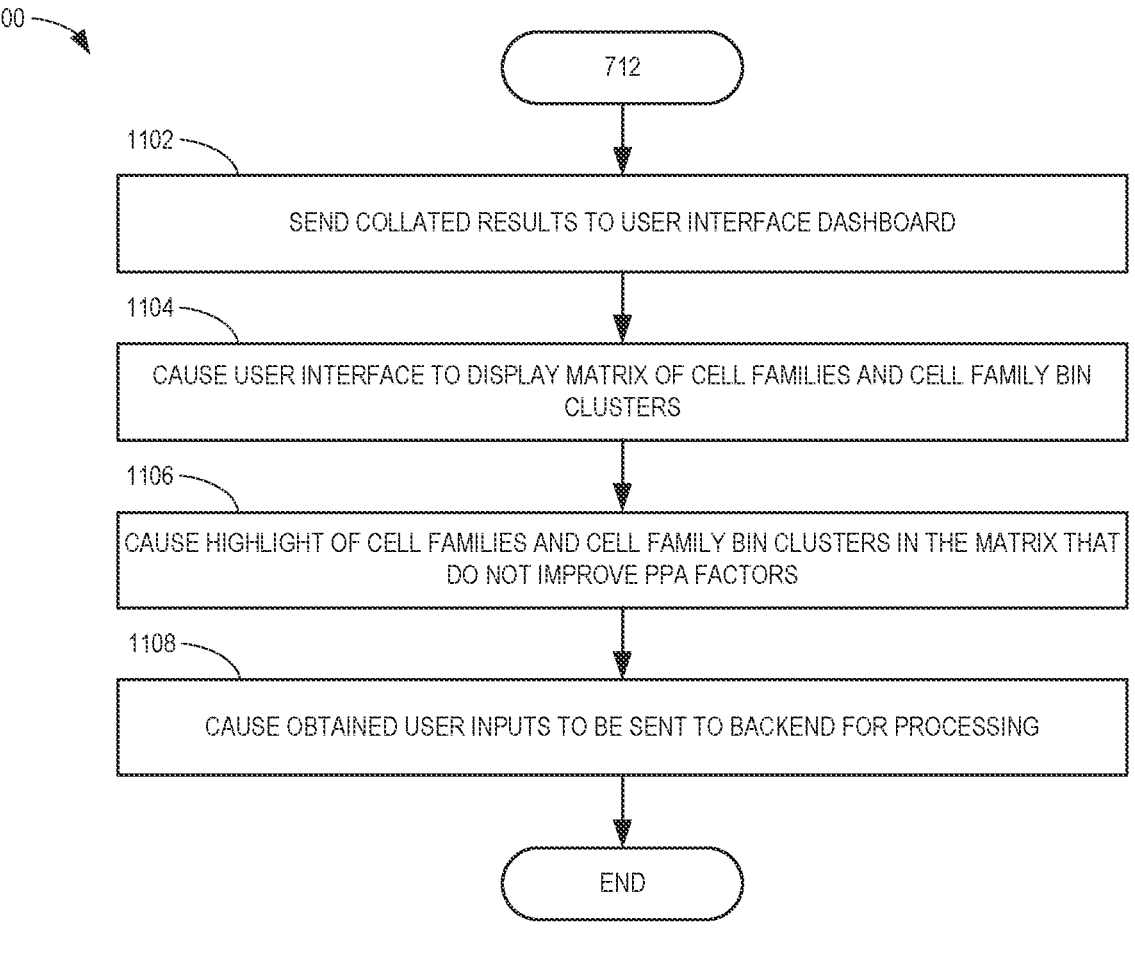
FIG. 11 is a flowchart representative of example machine readable instructions and/or example operations that may be executed and/or instantiated by processor circuitry to implement the cell library analytics circuitry of FIGS. 1 and 2 to cause a user interface to highlight and/or request removal of cell family bins and/or cell families.

In some examples, the automation interface circuitry 200 is instantiated by processor circuitry executing automation interface circuitry 200 instructions and/or configured to perform operations such as those represented by the flowchart of FIG. 11.

In some examples, the cell library analytics circuitry 116 includes means for causing a user interface to highlight and/or request removal of one or more cell family bins and/or one or more cell families. For example, the means for causing may be implemented by the automation interface circuitry 200. In some examples, the automation interface circuitry 200 may be instantiated by processor circuitry such as the example processor circuitry 1212 of FIG. 12. For instance, the automation interface circuitry 200 may be instantiated by the example microprocessor 1300 of FIG. 13 executing machine executable instructions such as those implemented by at least blocks 712 of FIG. 7 and 1102-1108 of FIG. 11. In some examples, the automation interface circuitry 200 may be instantiated by hardware logic circuitry, which may be implemented by an ASIC, XPU, or the FPGA circuitry 1400 of FIG. 14 structured to perform operations corresponding to the machine readable instructions. Additionally or alternatively, the automation interface circuitry 200 may be instantiated by any other combination of hardware, software, and/or firmware. For example, the automation interface circuitry 200 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

The example cell library analytics circuitry 116 includes PPA challenge determination circuitry 202. The example PPA challenge determination circuitry 202 determines whether a design block exhibits a PPA challenge. In some examples, a PPA challenge is an indicator that a design block is a source of a higher than average power consumption (e.g., average power consumption among multiple design blocks simulated/tested for power consumption), or the design block is a source of lower than expected performance (e.g., the performance of the design block under analysis may be a bottleneck for larger portions of the SoC), or the design block takes up a larger physical area (e.g., the $\mu m^2$ footprint of the design block as a percentage of the overall SoC $\mu m^2$ footprint). In some examples, if one or more of those indicators corresponding to one or more PPA factors are present and are associated with the design block in question, then a PPA challenge is present.

The example PPA challenge determination circuitry 202 obtains reports from one or more algorithms that simulate a design block in runtime on one or more workloads. Then the example PPA challenge determination circuitry 202 runs and collates PPA results based on the obtained reports to provide PPA data to a dashboard that can be viewed by a circuit designer/user. In some examples, the collated PPA data provides insight into a plurality of design blocks that make up the SoC being simulated, including relative PPA factor data among design blocks. The example PPA challenge determination circuitry 202 determines whether a given design block exhibits a PPA challenge by analyzing the collated PPA factor data. In some examples, the PPA challenge determination circuitry 202 provides one or more indicators that are to be displayed on the circuit designer/user's dashboard to visually illustrate the PPA challenge.

In some examples, the PPA challenge determination circuitry 202 is instantiated by processor circuitry executing PPA challenge determination circuitry 202 instructions and/or configured to perform operations such as those represented by the flowchart of FIG. 7.

In some examples, the cell library analytics circuitry 116 includes means for determining a design block with an SoC design exhibits a PPA challenge. For example, the means for determining may be implemented by the PPA challenge determination circuitry 202. In some examples, the PPA challenge determination circuitry 202 may be instantiated by processor circuitry such as the example processor circuitry 1212 of FIG. 12. For instance, the PPA challenge determination circuitry 202 may be instantiated by the example microprocessor 1300 of FIG. 13 executing machine executable instructions such as those implemented by at least block 702 of FIG. 7. In some examples, the PPA challenge determination circuitry 202 may be instantiated by hardware logic circuitry, which may be implemented by an ASIC, XPU, or the FPGA circuitry 1400 of FIG. 14 structured to perform operations corresponding to the machine readable instructions. Additionally or alternatively, the PPA challenge determination circuitry 202 may be instantiated by any other combination of hardware, software, and/or firmware. For example, the PPA challenge determination circuitry 202 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

As shown in FIG. 2, the example cell library analytics circuitry 116 includes design block parsing circuitry 204. The example design block parsing circuitry 204 parses a design block into a functional netlist of cell families. In examples disclosed herein, a functional netlist means a description of the functional assembly/connectivity of an electronic circuit made up of cell families. For example, a cell library provider 126 (FIG. 1) may provide a generic functional netlist that maps the behavioral description of a design block in an electronic circuit at a high level into an implementable version of the design block. Such an implementable version of the design block may include known combinatorial and/or sequential cells (e.g., a set of NAND, NOR, FLOP, etc. functional cells). The example design block parsing circuitry 204 generates a functional netlist of the functional cells described above that map to the design block. In some examples, the design block parsing circuitry 204 accesses the RTL description of the design block and converts the RTL description into a netlist (e.g., a functional netlist). In some examples, the functional netlist includes a list of all cells present in the design block and a count of each of the cells present. For example, a first type of NAND gate may be used eight times in the entire design block, a second type of NAND gate may be used 46 times, and a third type of NAND gate may not be used at all.

In some examples, the design block parsing circuitry 204 is instantiated by processor circuitry executing design block parsing circuitry 204 instructions and/or configured to perform operations such as those represented by the flowchart of FIG. 7.

In some examples, the cell library analytics circuitry 116 includes means for parsing a design block into a functional netlist of cell families. For example, the means for parsing may be implemented by the design block parsing circuitry 204. In some examples, the design block parsing circuitry 204 may be instantiated by processor circuitry such as the example processor circuitry 1212 of FIG. 12. For instance, the design block parsing circuitry 204 may be instantiated by the example microprocessor 1300 of FIG. 13 executing machine executable instructions such as those implemented by at least block 704 of FIG. 7. In some examples, the design block parsing circuitry 204 may be instantiated by hardware logic circuitry, which may be implemented by an ASIC, XPU, or the FPGA circuitry 1400 of FIG. 14 structured to perform operations corresponding to the machine readable instructions. Additionally or alternatively, the design block parsing circuitry 204 may be instantiated by any other combination of hardware, software, and/or firmware. For example, the design block parsing circuitry 204 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

As shown in FIG. 2, the example cell library analytics circuitry 116 includes cell family extraction circuitry 206. The example cell family extraction circuitry 206 extracts cell families from a functional netlist. In examples disclosed herein, a cell family includes multiple cells having a same general characteristic such as a family of NAND cells in which some of the NAND cells may correspond to different types of NAND cell implementations. For example, the functional netlist created by the design block parsing circuitry 204 includes the extracted cells that compose the design block, and, in some examples, similar cells (e.g., cell flavors) from the extracted cells define a cell family (e.g., 26 types of XOR gates may define a XOR cell family). In some examples, the cell family extraction circuitry 206 determines an occurrence count of cells in a cell family. For example, after the cell family extraction circuitry 206 determines all the cell families in the functional netlist, the cell family extraction circuitry 206 then determines a count of the occurrences (e.g., an occurrence count) of each cell family in the functional netlist. Then the example cell family extraction circuitry 206 sorts the functional netlist of cell families to generate a cell family distribution which may be represented in a decreasing occurrence count order (e.g., as shown in the cell family distribution charts of FIGS. 4A and 4B). In some examples, the example cell family extraction circuitry 206 determines a total occurrence count of all cell families in the functional netlist. For example, there may be 10,000 cells (or a higher or lower number of cells) that compose a design block (e.g., 10,000 total occurrence count of all cell families).

Figure 4A:
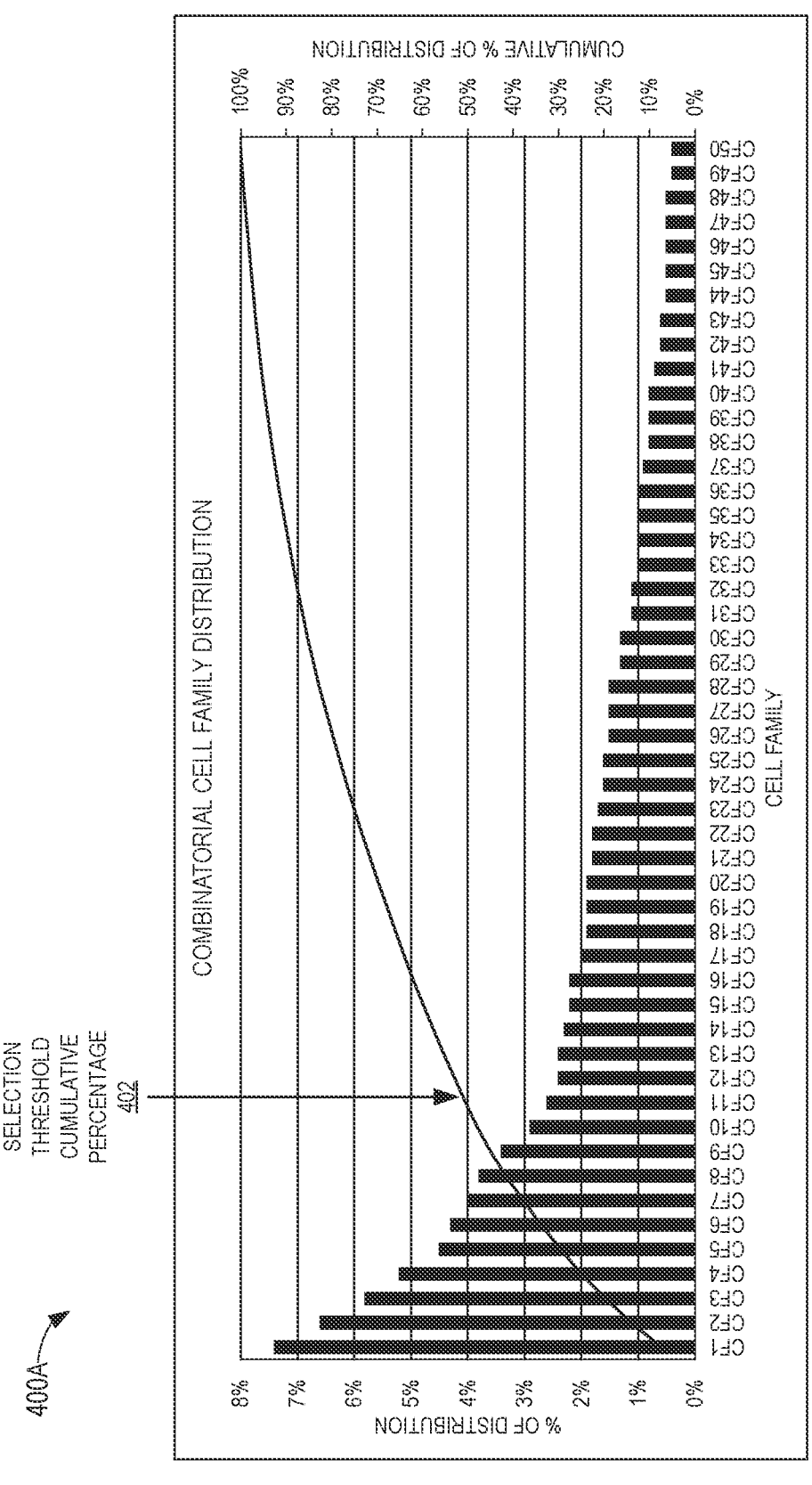
FIGS. 4A and 4B illustrate example cell family distribution charts.

FIG. 4A illustrates an example of a combinatorial cell family distribution chart 400A. For example, in a functional netlist that includes 50 different combinatorial cell families (listed on the X-axis of the chart), the cell families are sorted in a decreasing occurrence count. As used herein, a decreasing occurrence count means a cell count of cells in the first cell family in the sorted order has a largest number of cell occurrences in the design block. The left Y-axis (e.g., left vertical axis) of the example cell family distribution chart shows the percentage of cells in the design block (e.g., the percentage of the distribution of cells composing the design block). Thus, cells that are part of the example cell family 1 (CF1) amount to approximately 7.5% of the total cells in the design block, and cells that are part of the example cell family 50 (CF50) amount to approximately 0.4% of the total cells in the design block. In some examples, the percentage of the design block made up of cells from a cell family is calculated by dividing the occurrence count of cells in the cell family by the total occurrence count of all cell families in the functional netlist.

The right Y-axis of the example cell family distribution chart shows the cumulative percentage of cells of the distribution (e.g., the cumulative percentage of cells in the design block). For example, the CF1 through CF8 cell families make up approximately 40% of the overall number of cells in the distribution.

In some examples, a subset of the total cell families composing the functional netlist are used for PPA analysis for efficiency. For example, removing a cell family that includes cells making up 6% of the total cells in the design block will have a greater impact than removing a cell family that includes cells making up 0.5% of the total cells in the design block. In some examples, the cell family extraction circuitry 206 determines a selection threshold cumulative percentage of combinatorial cells 402. In examples disclosed herein, a selection threshold cumulative percentage represents a percentage of the total number of combinatorial cells in the cell library superset 118. For example, the selection threshold cumulative percentage of cells may be 50% or a lower or higher cumulative percentage. Once the cell family extraction circuitry 206 determines (e.g., selects) the selection threshold cumulative percentage, the cell family extraction circuitry 206 then extracts cell families from the functional netlist (starting with the largest/most dominant occurrence count cell family) until the selection threshold cumulative percentage is satisfied. At the conclusion of the extraction process, a group of extracted cell families is created.

Figure 4B:
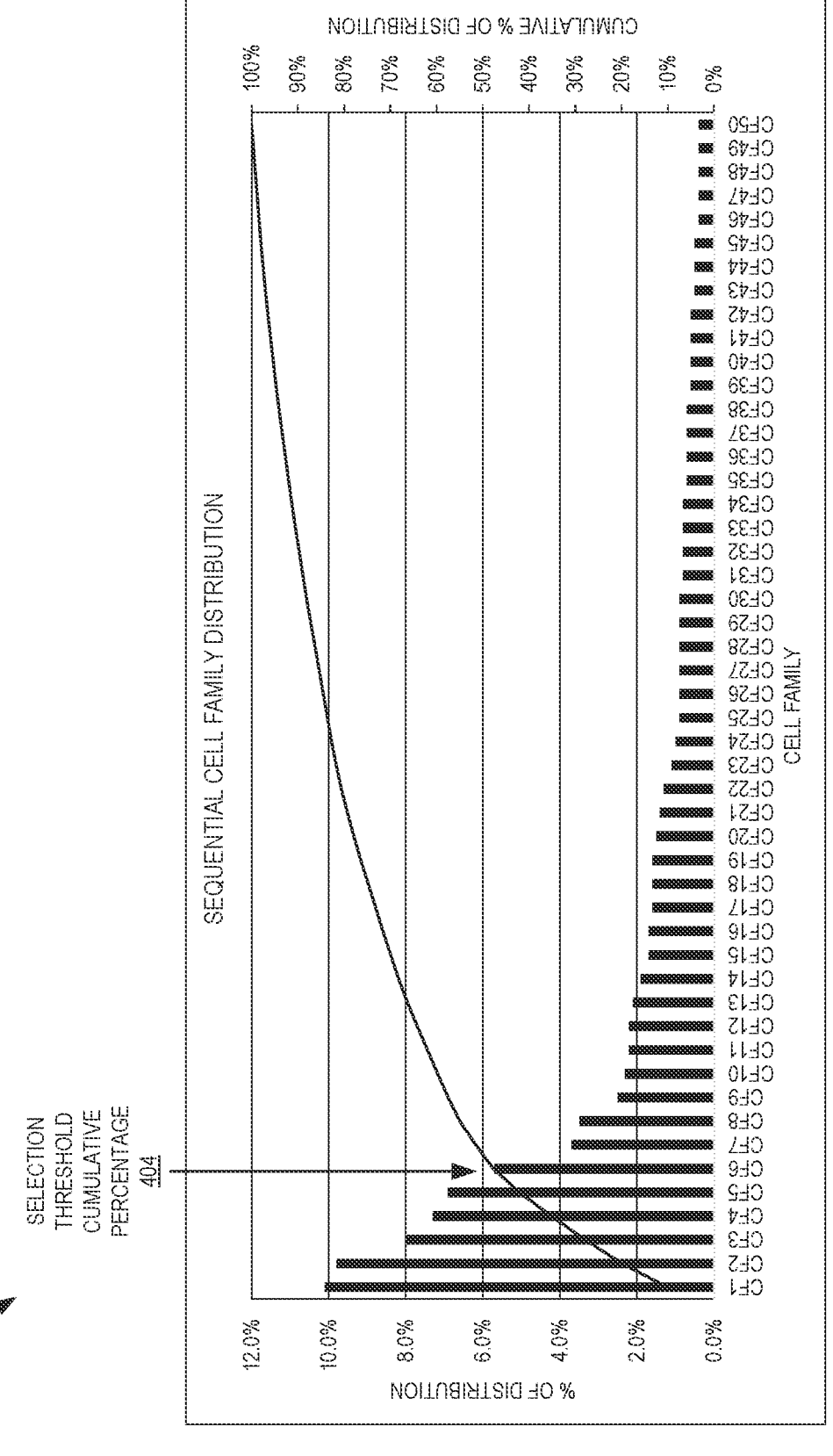

FIG. 4B illustrates an example combinatorial cell family distribution chart 400B. For example, in a functional netlist that includes 50 different sequential cell families (listed on the X-axis of the chart), the cell families are sorted in a decreasing occurrence count. In some examples, the cell family extraction circuitry 206 determines a selection threshold cumulative percentage of sequential cells 404. In examples disclosed herein, a selection threshold cumulative percentage of sequential cells represents a percentage of the total number of sequential cells in the cell library superset 118.

In some examples, the cell family extraction circuitry 206 may extract only combinatorial cells from a netlist. In some examples, the cell family extraction circuitry 206 may extract only sequential cells from a netlist. However, in some examples, the cell family extraction circuitry 206 may extract both combinatorial cells and sequential cells from a netlist. Focusing extraction on just combinatorial cells or sequential cells provides PPA factor value analyses on specific cell types. Alternatively, extracting both combinatorial cells and sequential cells from a netlist provides full PPA factor analyses across all cell types.

In some examples, the cell family extraction circuitry 206 performs the above described functions during the results analysis process flow block 312 of FIG. 3.

Figure 8:
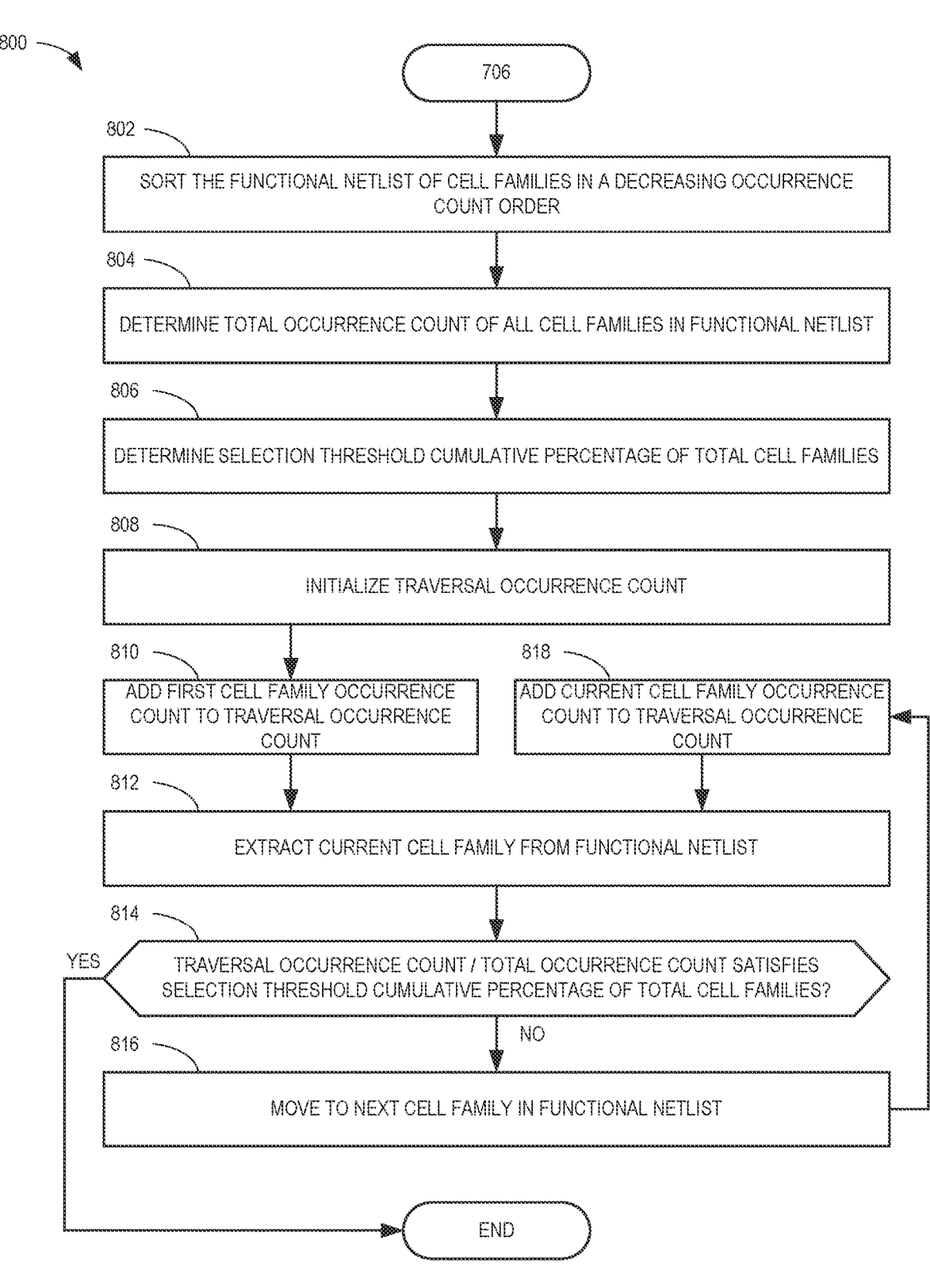
FIG. 8 is a flowchart representative of example machine readable instructions and/or example operations that may be executed and/or instantiated by processor circuitry to implement the cell library analytics circuitry of FIGS. 1 and 2 to extract cell families from a functional netlist.

In some examples, the cell family extraction circuitry 206 is instantiated by processor circuitry executing cell family extraction circuitry 206 instructions and/or configured to perform operations such as those represented by the flowcharts of FIGS. 7 and 8.

In some examples, the cell library analytics circuitry 116 includes means for generating a cell occurrence counts distribution based on cell families from the functional netlist. For example, the means for generating may be implemented by the cell family extraction circuitry 206. In some examples, the cell family extraction circuitry 206 may be instantiated by processor circuitry such as the example processor circuitry 1212 of FIG. 12. For instance, the cell family extraction circuitry 206 may be instantiated by the example microprocessor 1300 of FIG. 13 executing machine executable instructions such as those implemented by at least blocks 706 of FIG. 7 and 802-816 of FIG. 8. In some examples, the cell family extraction circuitry 206 may be instantiated by hardware logic circuitry, which may be implemented by an ASIC, XPU, or the FPGA circuitry 1400 of FIG. 14 structured to perform operations corresponding to the machine readable instructions. Additionally or alternatively, the cell family extraction circuitry 206 may be instantiated by any other combination of hardware, software, and/or firmware. For example, the cell family extraction circuitry 206 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine read-able instructions without executing software or firmware, but other structures are likewise appropriate.

Figure 5:
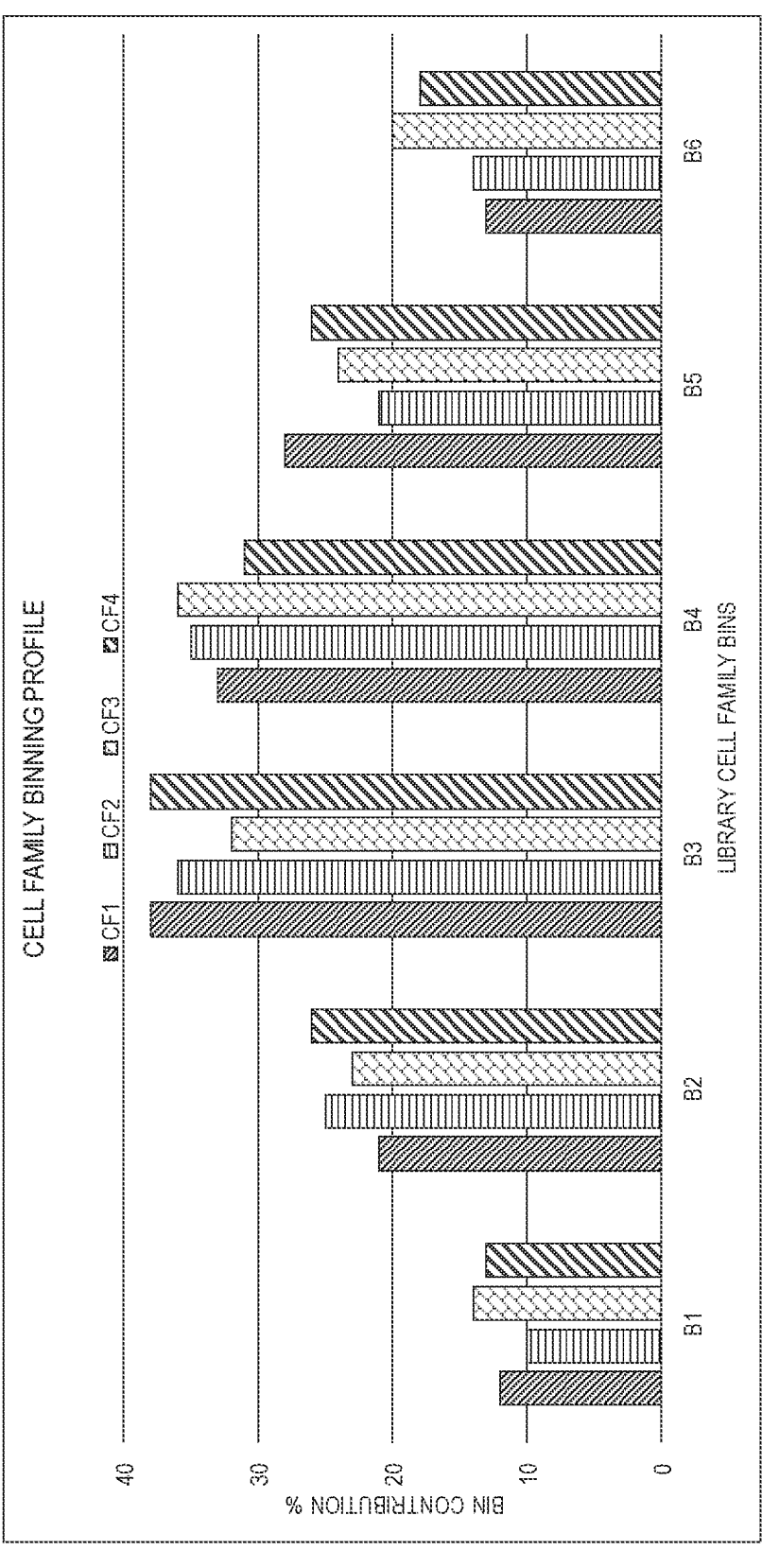
FIG. 5 illustrates an example cell family binning profile.

In the illustrated example in FIG. 2, the cell library analytics circuitry 116 includes bin grouping circuitry 208. The example bin grouping circuitry 208 groups extracted cell families into cell family bins by values of a fabrication parameter. In some examples, the bin grouping circuitry 208 groups cells with the same or similar fabrication parameter value. For example, if the fabrication parameter value is drive strength and there are 24 unique values of drive strength, cells across cell families are grouped together based on the drive strength. Such groupings may be referred to as drive strength one, drive strength two, etc. through drive strength 24. Thus, in some examples, drive strength two may correspond to the lowest drive strength among all cells within the extracted cell families. FIG. 5 is a chart that illustrates an example of a cell family binning profile. In examples disclosed herein, a cell family binning profile is a distribution of a cell family across a set of bins, where each bin in the set of bins corresponds to one or more values of a fabrication parameter (e.g., drive strength). In some examples, bin one (B1) may include drive strength two. Cell families one through four (CF1-CF4) include some cells that make up bin B1. In some examples, each bin may include four consecutive drive strengths. However, in some examples, some drive strength values are not associated with any of the cells in the extracted cell families. Thus, in some examples, to account for all drive strengths, the bin grouping circuitry 208 may merge two or more drive strengths into one common drive strength range that is associated with a bin. For example, drive strength eight may be well repre-sented by cell counts in the extracted cell family but adjacent drive strength nine may not be represented by any cell count. Thus, bin grouping circuitry 208 may merge drive strength nine with drive strength eight. In some examples, merging may occur when drive strengths are asymmetrically distrib-uted across a cell library. In some examples, merging two or more drive strengths includes concatenating two or more cell family bins. For example, a first cell family bin may include cells with a drive strength of two and a second cell family bin may include cells with a drive strength of three. In such an example, the cells in the first cell family bin may be concatenated with the cells in the second cell family bin, creating a merged cell family bin. In other examples, the bin grouping circuitry 208 may merge two or more values of a fabrication parameter other than drive strength (e.g., thresh-old voltage).

The cell family binning profile chart shown in FIG. 5 illustrates an example normal distribution (e.g., a Gaussian distribution) associated with drive strength values. For example, the bottom and top ends of the range of drive strength values may have less occurrence counts in the extracted cell families than those drive strength values closer to the middle of the range. In some examples, the bin grouping circuitry 208 may fit the bins to the normal curve by grouping together larger numbers of drive strength values in the middle of the range than the number of drive strength values grouped at the top and bottom of the drive strength value range. For example, if the drive strength range for the distribution illustrated in FIG. 5 is 2-25, then the bin grouping circuitry 208 may separate the 24 values into six bins of four drive strength values. The resulting bins of this grouping activity may include drive strengths 2-5 in B1, drive strengths 6-9 in B2, and so on. However, in other examples, a non-uniform distribution of drive strengths may be used to assign drive strengths across bins B1 through B6.

For example, B1 may include only drive strength two, but B3 may include drive strengths 6-12.

In some examples, the bin grouping circuitry 208 is instantiated by processor circuitry executing bin grouping circuitry 208 instructions and/or configured to perform operations such as those represented by the flowcharts of FIG. 7 and FIG. 9.

In some examples, the cell library analytics circuitry 116 includes means for grouping extracted cell families into cell family bins by values of a fabrication parameter. For example, the means for grouping may be implemented by bin grouping circuitry 208. In some examples, the bin grouping circuitry 208 may be instantiated by processor circuitry such as the example processor circuitry 1212 of FIG. 12. For instance, the bin grouping circuitry 208 may be instantiated by the example microprocessor 1300 of FIG. 13 executing machine executable instructions such as those implemented by at least blocks 708 of FIG. 7 and 902-920 of FIG. 9. In some examples, the bin grouping circuitry 208 may be instantiated by hardware logic circuitry, which may be implemented by an ASIC, XPU, or the FPGA circuitry 1400 of FIG. 14 structured to perform operations corre-sponding to the machine readable instructions. Additionally or alternatively, the bin grouping circuitry 208 may be instantiated by any other combination of hardware, software, and/or firmware. For example, the bin grouping circuitry 208 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instruc-tions without executing software or firmware, but other structures are likewise appropriate.

As shown in FIG. 2, the example cell library analytics circuitry 116 includes PPA improvement calculation cir-cuitry 210. The example PPA improvement calculation circuitry 210 determines one or more cell family bins and/or one or more cell families that do not improve PPA factors. In some examples, the PPA improvement calculation cir-cuitry 210 performs a PPA analysis on the full functional netlist (e.g., the functional netlist that includes the entire cell library superset 118) to determine a PPA factor value base-line to compare against. For example, the PPA analysis includes determining the power consumption, performance, and/or area of the design block.

The example PPA improvement calculation circuitry 210 then removes at least one cell family bin (e.g., bin B1 in FIG. 5) in the extracted portion of the functional netlist to create a modified functional netlist. In examples disclosed herein, the modified functional netlist includes at least one less cell family bin relative to a previous netlist.

In some examples, the PPA improvement calculation circuitry 210 then runs an iteration of the PPA analysis on the modified functional netlist to see if there is any improvement in PPA factors relative to the measurements of the PPA baseline. Multiple iterations may take place by performing PPA analyses on modified functional netlists that have different combinations of removed cell family bins. In some examples, the PPA improvement calculation circuitry 210 tags any cell family bin that does not show any improvement to a PPA factor across all combinations that were tested.

Additionally, the PPA improvement calculation circuitry 210 may perform such PPA analyses across multiple fabri-cation parameters, thus determining any cell family bin that does not improve any PPA factor for two or more fabrication parameters. For example, the PPA improvement calculation circuitry 210 may determine a cell family bin does not improve any PPA factor for a drive strength fabrication parameter and then determines the same cell family bin does not improve any PPA factor for a threshold voltage fabrication parameter. As a result, in some examples, the PPA improvement calculation circuitry 210 provides such information to the automation interface circuitry 200 for further processing to create a visual representation of the information to the circuit designer/user.

Figure 10:
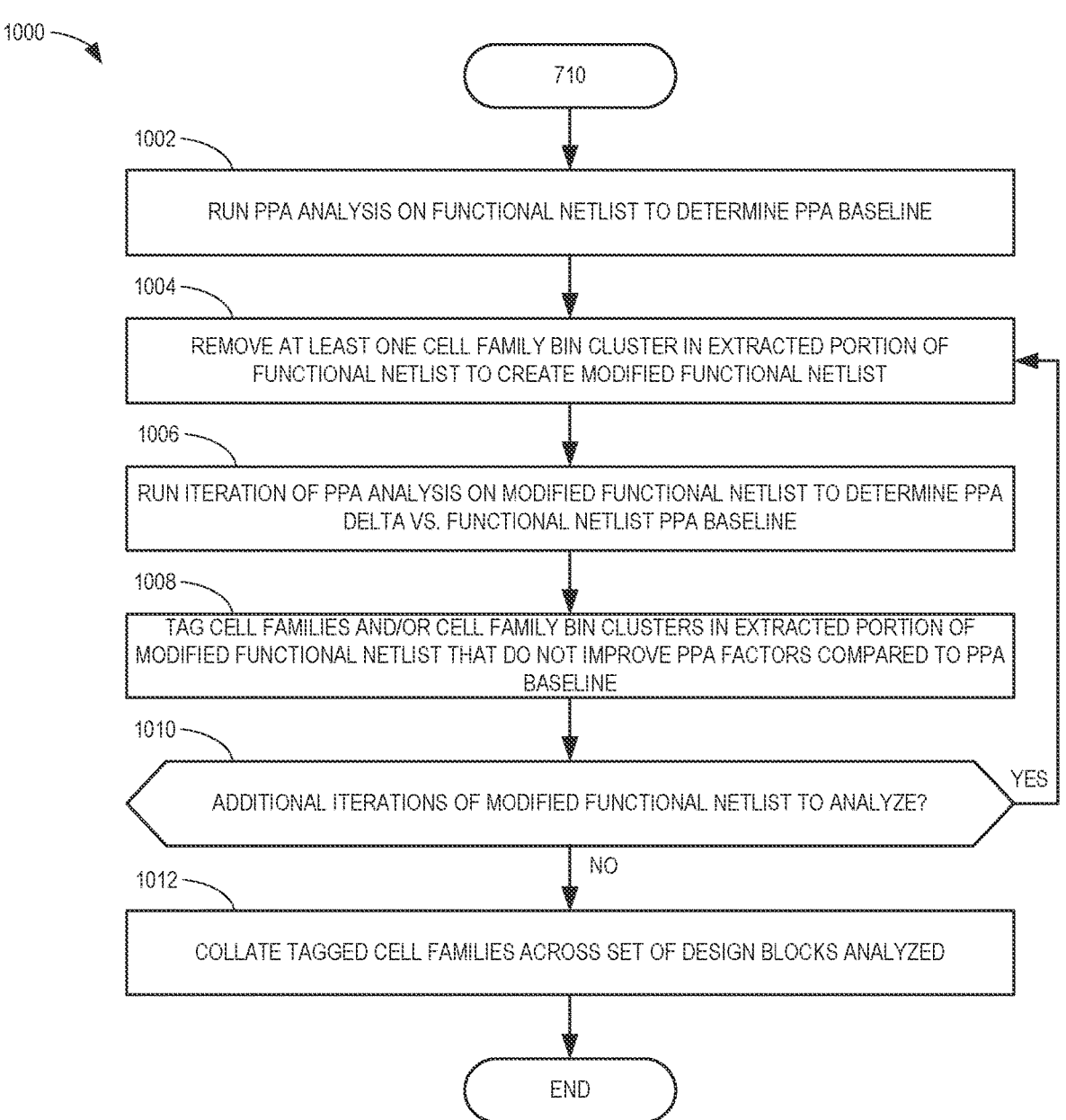
FIG. 10 is a flowchart representative of example machine readable instructions and/or example operations that may be executed and/or instantiated by processor circuitry to implement the cell library analytics circuitry of FIGS. 1 and 2 to determine cell family bins or cell families that do not improve PPA factors.

In some examples, the PPA improvement calculation circuitry 210 is instantiated by processor circuitry executing PPA improvement calculation circuitry 210 instructions and/or configured to perform operations such as those represented by the flowcharts of FIG. 7 and FIG. 10.

In some examples, the cell library analytics circuitry 116 includes means for determining one or more cell family bins and/or one or more cell families that do not improve PPA factors (e.g., the means for determining PPA improvement, or lack thereof). For example, the means for determining PPA improvement may be implemented by the PPA improvement calculation circuitry 210. In some examples, the PPA improvement calculation circuitry 210 may be instantiated by processor circuitry such as the example processor circuitry 1212 of FIG. 12. For instance, the PPA improvement calculation circuitry 210 may be instantiated by the example microprocessor 1300 of FIG. 13 executing machine executable instructions such as those implemented by at least blocks 710 of FIGS. 7 and 1002, 1006, 1008, 1010, and 1012 of FIG. 10. In some examples, the PPA improvement calculation circuitry 210 may be instantiated by hardware logic circuitry, which may be implemented by an ASIC, XPU, or the FPGA circuitry 1400 of FIG. 14 structured to perform operations corresponding to the machine readable instructions. Additionally or alternatively, the PPA improvement calculation circuitry 210 may be instantiated by any other combination of hardware, software, and/or firmware. For example, the PPA improvement calculation circuitry 210 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

After the FIG. 3 process flow finishes the results analysis 312, the automation interface circuitry 200 collates all run results (process flow block 314) to generate the data for the dashboard 316. The data for the dashboard 316 may include information to provide highlight capability to cause one or more cell family bins and/or one or more cells across fabrication parameter. In some examples, such a display is provided in a matrix of cell families vs. cell family bins.

Figure 6A:
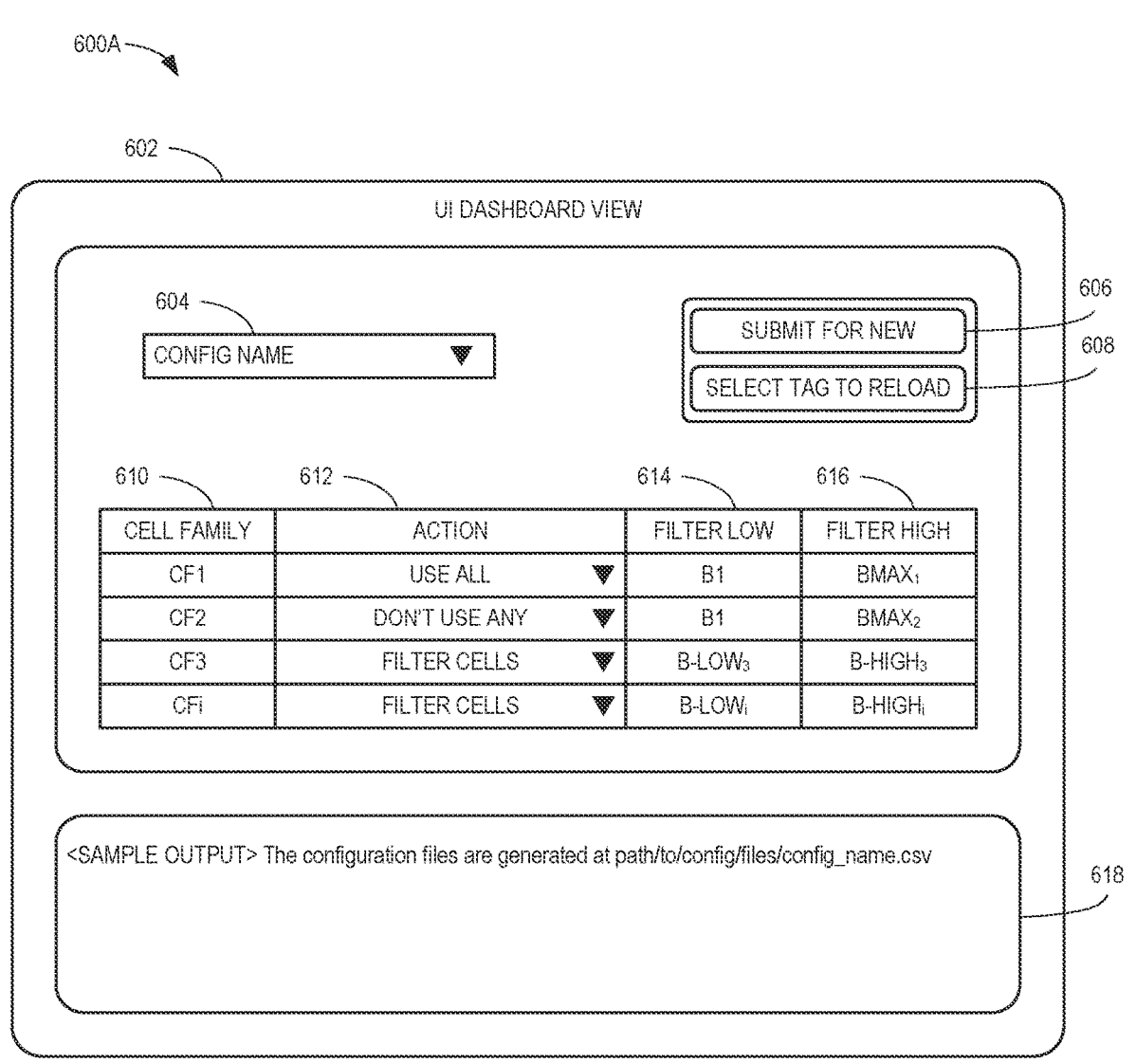
FIG. 6A illustrates an example user interface (UI) display to request user input to customize a functional netlist.

FIG. 6A illustrates an example UI dashboard display 600A to obtain user input to customize a functional netlist. In some examples, a UI dashboard view 602 may be presented by the computing device 102 (FIG. 1) via the display/UI 114 (FIG. 1). The example UI dashboard view 602 may include a drop down list of configuration names 604 to enable the user (e.g., a circuit designer) to specify a functional netlist configuration. For example, a baseline functional netlist configuration may include the entire cell library superset 118 of cells and a modified functional netlist configuration may include a subset of cells in the cell library superset 118.

In the illustrated example of FIG. 6A, if a new functional netlist configuration is selected, then the user may click on the "submit for new" button control 606. If a previously generated netlist configuration has been tagged as a saved configuration, the user may select the configuration name from the drop down list of configuration names 604 and click on the "select tag to reload" button control 608 to load the selected configuration.

The example UI dashboard view 602 may include filters for cell families 610. In some examples, for each cell family 610, the user may select an action 612 from an action drop down box to modify the functional netlist by including or removing cell families and/or portions of cell families. In some examples, a portion of a cell family may be selected as a candidate for removal by filtering cells that reside in one or more cell family bins at a lower and/or upper portion of the normal distribution of cell family bins (e.g., the cell family binning profile shown in FIG. 5). For example, the "action" drop down menu 612 may include an option to use all cells in a cell family ("USE ALL"), an option to not use any cells in a cell family ("DON'T USE ANY"), and an option to filter out some cells in a cell family ("FILTER CELLS"). In some examples, if the filter cell option is selected by the user, a low-pass filter (FILTER LOW 614) and a high-pass filter (FILTER HIGH 616) may be designated. In some examples, for a cell family binning profile as shown in FIG. 5, cells from a cell family may be in portions of each cell family bin. For example, in FIG. 5, cell family one (CF1) includes cells that are a portion of bins one through six (B1-B6) that are sorted based on a fabrication parameter. Thus, for any set of low and high-pass filters associated with a cell family:

$$B1 \leq BLOW \leq BHIGH \leq BMAX$$

In the illustrated example, the cell families 610 may be filtered per bin (e.g., cells within a cell family are filtered out of a modified functional netlist per bin). Example bin B1 is the lowest cell family bin of cells from each cell family. As described herein, a "lowest" or "highest" bin relates to the fabrication parameter values of the cells in the bin relative to the fabrication parameter values of other cells in the cell family. Example bin B-MAX is equal to the highest generated cell family bin (e.g., cell family bin six B6 in FIG. 5 is equal to B-MAX). Thus, using cell family three CF3 in FIG. 5 as an example, if FILTER LOW 614 is set to bin two B2 (e.g., B-LOW$_3$ equals B2) and FILTER HIGH 616 is set to bin five B5 (e.g., B-HIGH$_3$ equals B5), and the user selects to filter cells from the drop down action menu 612, then for the current configuration being modified, CF3 will include bins two through five (B2-B5) and remove bins one and six (B1 and B6) from a modified version of the functional netlist.

In some examples, the UI dashboard view 602 may include a sample output dialog box 618 that displays the results of the modified configuration files 306 (FIG. 3) to be used to format a functional netlist for simulation runs in a users' run area 308 (FIG. 3). Thus, the UI dashboard view 602 is a user interface to enable a user to modify a functional netlist for upload as a configuration file 306 to the users' run area 308.

Figure 6B:
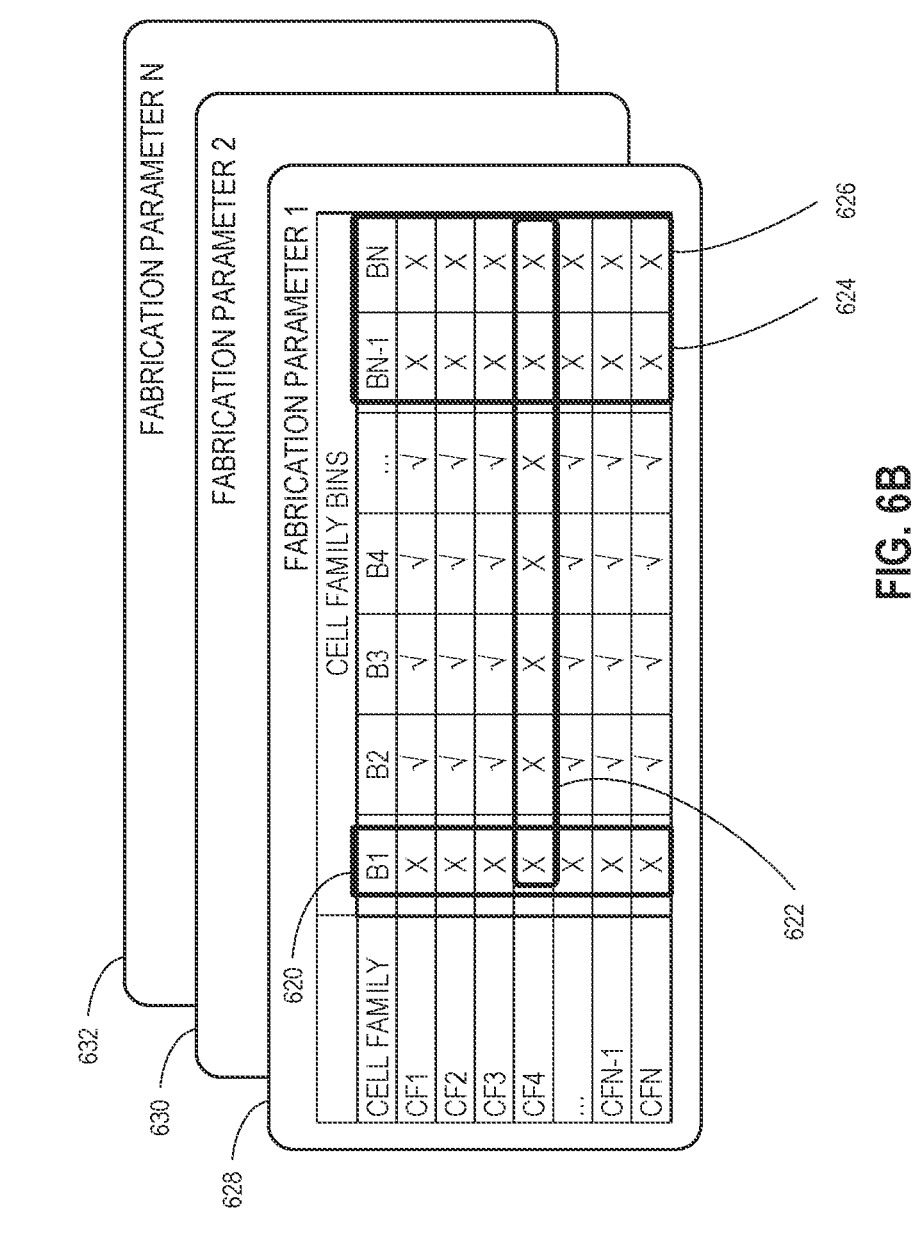
FIG. 6B illustrates an example UI dashboard matrix display highlighting cell families and cell family bins.

FIG. 6B illustrates an example UI dashboard matrix display 600B highlighting cell families and cell family bins for different fabrication parameters. In some examples, the UI dashboard matrix display 600B is provided as an additional portion of the UI dashboard 600A (FIG. 6A) to provide insight into the cell families and/or cell family bins that should be removed from the functional netlist. The example UI dashboard matrix display 600B may be presented by the computing device 102 (FIG. 1) via the display/UI 114 (FIG. 1). As used herein, an X in the matrix in FIG. 6B denotes the cells of a cell family within the bin designated by X does not improve PPA factors for a given fabrication parameter. As used herein, a checkmark in the matrix in FIG. 6B denotes the cells of a cell family within the bin designated by √ does improve at least one PPA factor for a given fabrication parameter. In some examples, if an entire cell family bin, across all cell families within the bin, does not improve at least one PPA factor, then the automation interface circuitry 200 (FIG. 2) highlights the entire bin visually. An example of such highlighting is shown in FIG. 6B as a box 620 around the B1 bin. In some examples, if an entire cell family does not improve at least one PPA factor, then the automation interface circuitry 200 highlights the entire cell family visually. An example of such highlighting is shown in FIG. 6B as a box 622 around the CF4 cell family. The example automation interface circuitry 200 causes the user interface to display a version of the matrix illustrated in FIG. 6B. Additionally, in some examples automation interface circuitry 200 causes the highlight of a cell family and/or a cell family bin when such cell family or cell family bin does not improve the PPA factor values. In some examples, this takes place across multiple ones of or all of the separate fabrication parameters for which PPA analyses were performed. In some examples, for user display/navigation purposes, the matrix illustrated in FIG. 6B may include a grid/table of cell family bins (e.g., a first dimension of the matrix) with cell families (e.g., a second dimension of the matrix) for each fabrication parameter (e.g., a third dimension of the matrix), such as fabrication parameter 1 (628), fabrication parameter 2 (630), and on up to fabrication parameter N (630).

The example automation interface circuitry 200 causes the user interface to highlight cell family bins and/or cell families for removal when such cell family bins and/or cell families do not improve PPA factor values. In some examples, if the circuit designer/user of the UI selects a cell family or a cell family bin for removal, that information is retrieved as user input data 302. The example UI dashboard 300A receives the user input data 302 as data 300C and sends it to the backend workspace 120 for processing.

Returning to FIG. 2, the example cell library analytics circuitry 116 includes cell management circuitry 212. The example cell management circuitry 212 removes a cell family bin in an extracted portion of the functional netlist to create the modified functional netlist. For example, the functional netlist of extracted cell family bins may include bins B1 through B6 (FIG. 5), and the example cell management circuitry 212 may remove B1 from the list of extracted cell family bins to create a modified functional netlist without the cells from B1. In this manner, the modified functional netlist enables simulation and testing of the PPA factors while using the modified functional netlist. In some examples, in another iteration of testing, bin B1 may need to be used again, thus, the cell management circuitry 212 may reinstate the previously removed bin B1 to create a second version of a modified functional netlist (or recreate the original version of the functional netlist).

In some examples, the cell management circuitry 212 is instantiated by processor circuitry executing cell management circuitry 212 instructions and/or configured to perform operations such as those represented by the flowchart of FIG. 10.

In some examples, the cell library analytics circuitry 116 includes means for removing at least one cell family bin in an extracted portion of a functional netlist to create a modified functional netlist. For example, the means for removing may be implemented by the cell management circuitry 212. In some examples, the cell management circuitry 212 may be instantiated by processor circuitry such as the example processor circuitry 1212 of FIG. 12. For instance, the cell management circuitry 212 may be instantiated by the example microprocessor 1300 of FIG. 13 executing machine executable instructions such as those implemented by at least blocks 1004 of FIG. 10. In some examples, the cell management circuitry 212 may be instantiated by hardware logic circuitry, which may be implemented by an ASIC, XPU, or the FPGA circuitry 1400 of FIG. 14 structured to perform operations corresponding to the machine readable instructions. Additionally or alternatively, the cell management circuitry 212 may be instantiated by any other combination of hardware, software, and/or firmware. For example, the cell management circuitry 212 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) structured to execute some or all of the machine readable instructions and/or to perform some or all of the operations corresponding to the machine readable instructions without executing software or firmware, but other structures are likewise appropriate.

While an example manner of implementing the cell library analytics circuitry 116 of FIG. 11 is illustrated in FIG. 2, one or more of the elements, processes, and/or devices illustrated in FIG. 2 may be combined, divided, re-arranged, omitted, eliminated, and/or implemented in any other way. Further, the example PPA challenge determination circuitry 202, the example design block parsing circuitry 204, the example cell family extraction circuitry 206, the example bin grouping circuitry 208, the example PPA improvement calculation circuitry 210, the example cell management circuitry 212, the example automation interface circuitry 200, and/or, more generally, the example cell library analytics circuitry 116, may be implemented by hardware alone or by hardware in combination with software and/or firmware. Thus, for example, any of the example PPA challenge determination circuitry 202, the example design block parsing circuitry 204, the example cell family extraction circuitry 206, the example bin grouping circuitry 208, the example PPA improvement calculation circuitry 210, the example cell management circuitry 212, the example automation interface circuitry 200, and/or, more generally, the example cell library analytics circuitry 116, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programcell library analytics circuitry 116e Gate Arrays (FPGAs). Further still, the example cell library analytics circuitry 116 of FIG. 1 may include one or more elements, processes, and/or devices in addition to, or instead of, those illustrated in FIG. 1, and/or may include more than one of any or all of the illustrated elements, processes and devices.

Flowcharts representative of example hardware logic circuitry, machine readable instructions, hardware implemented state machines, and/or any combination thereof for implementing the cell library analytics circuitry 116 of FIGS. 1 and 2 are shown in FIGS. 7-11. The machine readable instructions may be one or more executable programs or portion(s) of an executable program for execution by processor circuitry, such as the processor circuitry 1212 shown in the example processor platform 1200 discussed below in connection with FIG. 12 and/or the example processor circuitry discussed below in connection with FIGS. 13 and/or 14. The program(s) may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entirety of the program(s) and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program(s) is/are described with reference to the flowcharts illustrated in FIGS. 7-11, many other methods of implementing the example cell library analytics circuitry 116 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 7-11 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer readable instructions, machine readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 7 is a flowchart representative of example machine readable instructions and/or example operations 700 that may be executed and/or instantiated by processor circuitry to implement library analytics and guided partitioning to perform PPA analyses and/or PPA selection during semiconductor chip design. The machine readable instructions and/or the operations 700 of FIG. 7 begin at block 702, at which the example PPA challenge determination circuitry 202 (FIG. 2) determines a design block exhibiting a PPA challenge. For example, the PPA challenge determination circuitry 202 may detect a PPA challenge by determining a design block does not satisfy a design target. As described herein, a design target is a value of a PPA factor for a design block determined by at least one of the circuit design automation software and/or a circuit designer/user. For example, a design block may have an area design target of 75 μm². If the example design block generated by a circuit design automation software algorithm has an area of 85 μm², the design target is not satisfied (e.g., the design block has too large of a physical area footprint). In some examples, the design target value for a PPA factor value may be configured/set in advance or updated as an average PPA factor value for similar design blocks over time.

At block 704, the example design block parsing circuitry 204 (FIG. 2) parses the design block into a functional netlist of cell families.

At block 706, the example cell family extraction circuitry 206 (FIG. 2) extracts cell families from the functional netlist until a selection threshold cumulative percentage is satisfied. For example, a selection threshold cumulative percentage represents a percentage of cell families in a cell library superset 118 (FIG. 1) on which to perform PPA analyses and/or PPA selection during semiconductor chip design. In some examples, a value for the selection threshold cumulative percentage may be selected by a user to control the percentage of cell families in the cell library superset 118 that are analyzed for PPA factors. The selection threshold cumulative percentage value may be stored in a configuration file for subsequent use. The selection threshold cumulative percentage value may be a percentage from 0% (no cell families are analyzed for PPA factors) to 100% (e.g., the entire cell library superset 118 is analyzed for PPA factors). In some examples, once the cell families are parsed from the design block and sorted based on occurrence frequency, a distribution of cell families by occurrence frequency illustrates the most common (e.g., frequently occurring) cell families (e.g., see FIG. 4A for an example combinatorial cell family distribution and FIG. 4B for a sequential cell family distribution). Example functions that may be used to implement block 706 are described in greater detail below in connection with FIG. 8.

At block 708, the example bin grouping circuitry 208 (FIG. 2) groups extracted cell families into cell family bins by values of a fabrication parameter. For example, the bin grouping circuitry 208 may generate bin clusters similar to those shown in FIG. 5. Example functions that may be used to implement block 708 are described in greater detail below in connection with FIG. 9.

At block 710, the example PPA improvement calculation circuitry 210 (FIG. 2) determines one or more cell family bins and/or one or more cell families that do not improve PPA factors. Example functions that may be used to implement block 710 are described in greater detail below in connection with FIG. 10.

At block 712, the example automation interface circuitry 200 (FIG. 2) causes a user interface to highlight and/or request removal of the one or more cell family bins and/or the one or more cell families that were determined from block 710. Example functions that may be used to implement block 712 are described in greater detail below in connection with FIG. 11.

After block 712 is complete, the machine readable instructions and/or operations 700 of FIG. 7 end.

FIG. 8 is a flowchart representative of example machine readable instructions and/or example operations 800 that may be executed and/or instantiated by processor circuitry to extract cell families from a functional netlist. In some examples, the machine readable instructions and/or the operations 800 of FIG. 8 can be executed and/or instantiated by processor circuitry to implement block 706 of the machine readable instructions and/or the operations 700 of FIG. 7.

The machine readable instructions and/or the operations 800 of FIG. 8 begin at block 802, at which the example cell family extraction circuitry 206 (FIG. 2) sorts the functional netlist of cell families in a decreasing occurrence count order. For example, the cell family extraction circuitry 206 may generate a cell family distribution similar to what is shown in FIGS. 4A and/or 4B.

At block 804, the example cell family extraction circuitry 206 determines a total occurrence count of all cell families in the functional netlist.

At block 806, the example cell family extraction circuitry 206 determines a selection threshold cumulative percentage of total cell families. For example, the cell family extraction circuitry 206 may calculate the selection threshold cumulative percentage 402B of FIG. 4B.

At block 808, the example cell family extraction circuitry 206 initializes a traversal occurrence count. In examples disclosed herein, a traversal occurrence count is a temporary count used to compare a count of cell family occurrences as the cell family extraction circuitry 206 traverses the functional netlist. For example, assume there are 10,000 cells in the functional netlist provided by a cell library provider and assume that the selection threshold cumulative percentage is 50% of the total number of cells found in the functional netlist. As the cell family extraction circuitry 206 traverses the functional netlist, each cell family will have a count of occurrences of cells within that family. Thus, starting at the cell family with the highest occurrence count, the example cell family extraction circuitry 206 begins extracting cell families from the functional netlist to an extracted netlist. As described herein, an extracted netlist is a portion of the functional netlist that includes the cell families with the highest occurrence counts. The example cell family extraction circuitry 206 stops further extraction once the traversal occurrence count divided by the total number of cells in the functional netlist is greater than or equal to the selection threshold cumulative percentage. Thus, if 10,000 cells are in the functional netlist and the selection threshold cumulative percentage is 50%, the example cell family extraction circuitry 206 continues extracting cell families from the functional netlist until the cumulative count of cells in the extracted set of cell families is greater than or equal to 5,000 cells.

At block 810, the example cell family extraction circuitry 206 adds a first cell family occurrence count to the traversal occurrence count (e.g., a running total) to update the traversal occurrence count.

At block 812, the example cell family extraction circuitry 206 extracts the current cell family from the functional netlist, which places a copy of the extracted cell family in the extracted netlist.

At block 814, the example cell family extraction circuitry 206 determines whether the traversal occurrence count divided by the total occurrence count satisfies the selection threshold cumulative percentage of total cell families. In some examples, the selection threshold cumulative percentage is 50% of the total cell families. In other examples, the selection threshold cumulative percentage may be configured to be greater than or less than 50% of the total cell families.

If the traversal occurrence count divided by the total occurrence count does not satisfy the selection threshold cumulative percentage of total cell families, then at block 816, the example cell family extraction circuitry 206 moves to the next cell family in the functional netlist. In some examples, the cell family extraction circuitry 206 traverses the dominant cell families (e.g., cell families with the highest occurrence counts) in the functional netlist until the cumulative number of cells across the one or more extracted dominant cell families divided by the total number of cells in the cell library superset 118 is greater than or equal to the selection threshold cumulative percentage.

At block 818, the example cell family extraction circuitry 206 adds the current cell family occurrence count to the traversal occurrence count and then returns to block 812.

Returning to block 814, if the cell family extraction circuitry 206 determines that the selection threshold cumulative percentage of extracted cells from one or more most dominant cell families is satisfied, then the machine readable instructions and/or operations 800 of FIG. 8 end.

FIG. 9 is a flowchart representative of example machine readable instructions and/or example operations 900 that may be executed and/or instantiated by processor circuitry to group extracted cell families into cell family bins. In some examples, the machine readable instructions and/or the operations 900 of FIG. 9 can be executed and/or instantiated by processor circuitry to implement block 708 of the machine readable instructions and/or the operations 700 of FIG. 7.

The machine readable instructions and/or the operations 900 of FIG. 9 begin at block 902, at which the example bin grouping circuitry 208 (FIG. 2) determines a total number of cell families extracted from a functional netlist. In some examples, the total number of extracted cell families is obtained from the cell family extraction circuitry 206 (FIG. 2).

At block 904, the example bin grouping circuitry 208 determines a total number of cell family bins to create. In some examples, the determination may be based on a total number of cell families. For example, if the total number of cell families in the functional netlist is 80 cell families, then approximately 20 cell family bins may need to be created if a ratio of cell families to cell family bins is 4-to-1. In some examples, other ratios may be utilized to determine the number of cell family bins to create. In the illustrated example, the created cell family bin clusters are used to group cells across multiple cell families that exhibit similar values of a fabrication parameter. For example, if eight cell families have been extracted from the functional netlist, ones of the eight extracted cell families or all of the eight extracted cell families include cells with multiple fabrication parameter values. For example, an extracted NAND cell family may have 46 cells and of the 46 cells there are 32 different drive strength values. In examples disclosed herein, the 46 cells may be sorted into 6 different bins. For example, bin B1 may include cells with drive strengths between 2 and 3, bin B2 may include cells with drive strengths between 4 and 8, etc. In some examples, the bins include cells from ones of extracted cell families, up to the number of extracted cell families.

At block 906, the example bin grouping circuitry 208 sorts extracted cell families in an order based on a fabrication parameter value. For example, if the fabrication parameter is drive strength, then the extracted cell families will be sorted from a low drive strength to a high drive strength.

At block 908, the example bin grouping circuitry 208 merges adjacent cell families to at least one anchor cell family for each fabrication parameter value. In examples disclosed herein, adjacent cell families (and/or approximately adjacent cell families) refer to cell families with fabrication parameter values that are adjacent or approximately adjacent. For example, a first cell family that includes cells with a drive strength of four is adjacent to a second cell family that includes cells with a drive strength of five. In such an example, if the second cell family does not have cells representing a drive strength of four, the bin grouping circuitry 208 may designate the first cell family as an anchor cell family for the drive strength of four and at least merge cells from the second cell family with the drive strength of five with the first cell family. In examples disclosed herein, an anchor cell family is related to a specific fabrication parameter value (e.g., drive strength), where the anchor cell family includes cells that at least have the specific fabrication parameter value. Thus, the example anchor cell family can be grouped/merged/concatenated with one or more adjacent cell families that do not have cells representing the specific fabrication parameter value and the merged cell family grouping provides a non-zero number of cells that exhibit the specific fabrication parameter value. In some examples, not all values of a fabrication parameter are represented by cell families present in the netlist. Thus, in such situations, multiple values of the fabrication parameter may be merged into a single cell family. For example, if the fabrication parameter is drive strength and there are no drive strength values at 10, 11, or 13, for a NAND gate cell family, but there are substantial occurrences of cells from the NAND gate cell family at drive strength value 12, then the bin grouping circuitry 208 may merge the cells in the cell families associated with drive strengths 10, 11, and 13 into the cell family associated with drive strength 12.

At block 910, the example bin grouping circuitry 208 determines the approximate size of each cell family bin. For example, the bin grouping circuitry 208 may determine the approximate size of each cell family bin by fitting a total number of extracted cell families into a normal distribution. In some examples, in a normal distribution, the extracted cell families at the bottom and top of the normal curve are less in count than the extracted cell families in the middle of the curve. Thus, the example bin grouping circuitry 208 may group more cell families into cell family bins in the middle of the normal distribution and less cell families into the cell family bins at the ends of the normal distribution. For example, the cell family bins at the ends of the normal distribution may include one or two cell families and the cell family bins in the middle of the normal distribution may include 4-6 or more cell families. In some examples, this may allow for additional fine-tuning by allowing removal of cell families with less prevalence in the extracted functional netlist, which will not modify PPA factor values of the design block as drastically as cell families with more cell occurrences in the functional netlist. In some examples, approximate size means a size that is within a closest one cell family from being as accurate as available to fit the cell family bin to the normal distribution.

At block 912, the example bin grouping circuitry 208 adds the current extracted cell family to the current cell family bin to update the current cell family bin.

At block 914, the example bin grouping circuitry 208 determines whether additional extracted cell families are present to cluster.

If additional extracted cell families are present to cluster (block 914: YES), then, at block 916, the example bin grouping circuitry 208 determines whether the current cell family bin approximate size has been reached. In some examples, the approximate size of the cell family bin is determined at block 910. If no additional extracted cell families are present to cluster (block 914: NO), then the machine readable instructions and/or operations 900 of FIG. 9 end.

If the current cell family bin approximate size has been reached, then at block 918, the example bin grouping circuitry 208 processes the next family bin.

Alternatively, if the current cell family bin cluster approximate size has not been reached (block 916: NO), or after the bin grouping circuitry 208 processes the next family bin cluster, control proceeds to block 920 at which the example bin grouping circuitry 208 processes the next extracted cell family. Control then returns to block 912.

Returning to block 914, if the example bin grouping circuitry 208 determines that there are no additional extracted cell families to cluster, then the machine readable instructions and/or operations 900 of FIG. 9 end.

FIG. 10 is a flowchart representative of example machine readable instructions and/or example operations 1000 that may be executed and/or instantiated by processor circuitry to determine cell family bins or cell families that do not improve PPA factors. In some examples, the machine readable instructions and/or the operations 1000 of FIG. 10 can be executed and/or instantiated by processor circuitry to implement block 710 of the machine readable instructions and/or the operations 700 of FIG. 7.

The machine readable instructions and/or the operations 1000 of FIG. 10 begin at block 1002, at which the example PPA improvement calculation circuitry 210 (FIG. 2) runs a PPA analysis on the functional netlist to determine the PPA baseline of the functional netlist (e.g., the netlist that includes the entire cell library superset).

At block 1004, the example cell management circuitry 212 (FIG. 2) removes at least one cell family bin in the extracted portion of the functional netlist to create a modified functional netlist.

At block 1006, the example PPA improvement calculation circuitry 210 runs an iteration of the PPA analysis on the modified functional netlist to determine a PPA delta relative to the functional netlist PPA baseline.

At block 1008, the example PPA improvement calculation circuitry 210 tags cell families and/or cell family bins in the extracted portion of the modified functional netlist that do not improve PPA factors compared to the PPA baseline. Examples of such tagging are described above in connection with FIGS. 6A and 6B.

At block 1010, the example PPA improvement calculation circuitry 210 determines whether there are additional iterations of the modified functional netlist to analyze. For example, if there are 8 cell family bins, theoretically there may be up to 256 combinations of cell family bins exposed to the PPA analysis algorithms. But realistically, there will be a known handful of combinations that may be tested. Namely, in some examples, the PPA improvement calculation circuitry 210 may remove cell family bins at or near the edges of the normal bell curve (e.g., those cell family bins that make up a smaller percentage of the overall cell family usage in a given design block). For example, cell family bin B1 on the left edge of the normal distribution curve may be removed first and the remaining cell family bins will be used in a modified functional netlist, for PPA testing purposes. If cell family bin B1 causes an improvement to one or more PPA factors, then the example PPA improvement calculation circuitry 210 may decide to remove cell family bins B1 and B2 from the modified functional netlist for a next PPA test. If additional iterations of a modified functional netlist are to be analyzed, then the process returns to block 1004. Otherwise, if no additional iterations of a modified functional netlist are to be analyzed, then the process continues at block 1012.

At block 1012, the example PPA improvement calculation circuitry 210 collates the tagged cell families across one or more design blocks that have been analyzed. Such collating may be used to represent the UI dashboard matrix display 600B of FIG. 6B.

After block 1012 is complete, the machine readable instructions and/or operations 1000 of FIG. 10 end.

FIG. 11 is a flowchart representative of example machine readable instructions and/or example operations 1100 that may be executed and/or instantiated by processor circuitry to cause a user interface to highlight and/or request removal of cell family bins and/or cell families. In some examples, the machine readable instructions and/or the operations 1100 of FIG. 11 can be executed and/or instantiated by processor circuitry to implement block 712 of the machine readable instructions and/or the operations 700 of FIG. 7.

The machine readable instructions and/or the operations 1100 of FIG. 11 begin at block 1102, at which the example automation interface circuitry 200 (FIG. 2) sends collated results to a user interface dashboard.

At block 1104, the example automation interface circuitry 200 causes a user interface to display a matrix of cell families and cell family bins. For example, the display/UI 114 (FIG. 1) can render the matrix of cell families and cell family bin clusters in a manner similar to the UI dashboard matrix display 600 of FIG. 6B.

At block 1106, the example automation interface circuitry 200 causes a highlight of cell families and cell family bins in the matrix that do not improve PPA factors. For example, bins B1 620, BN–1 624, BN 626, and cell family CF4 622 are shown as highlighted in FIG. 6B.

At block 1108, the example automation interface circuitry 200 causes obtained user inputs to be sent to a backend for processing. In examples disclosed herein, the automation interface circuitry 200 takes as input user selection options described above in connection with FIGS. 6A and/or 6B.

After block 1108 is complete, the machine readable instructions and/or operations 1100 of FIG. 11 end.

Figure 12:
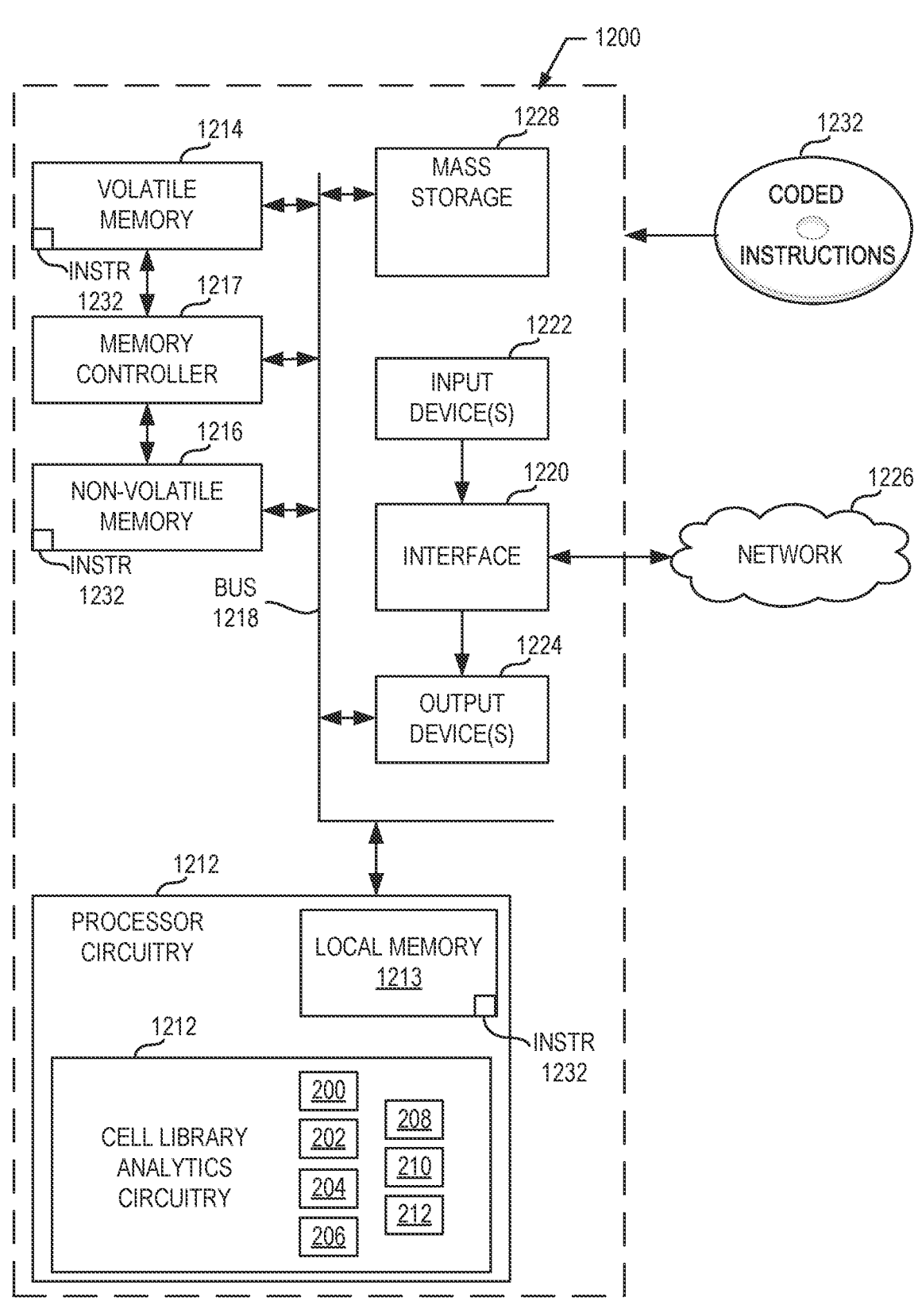
FIG. 12 is a block diagram of an example processing platform including processor circuitry structured to execute the example machine readable instructions and/or the example operations of FIGS. 7-11 to implement the cell library analytics circuitry 116 of FIG. 1.

FIG. 12 is a block diagram of an example processor platform 1200 structured to execute and/or instantiate the machine readable instructions and/or the operations of FIGS. 7-11 to implement the apparatus of FIG. 1. The processor platform 1200 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 1200 of the illustrated example includes processor circuitry 1212. The processor circuitry 1212 of the illustrated example is hardware. For example, the processor circuitry 1212 can be implemented by one or more integrated circuits, logic circuits, FPGAs, microprocessors, CPUs, GPUs, DSPs, and/or microcontrollers from any desired family or manufacturer. The processor circuitry 1212 may be implemented by one or more semiconductor based (e.g., silicon based) devices. In this example, the processor circuitry 1212 implements the PPA challenge determination circuitry 202, the design block parsing circuitry 204, the cell family extraction circuitry 206, the bin grouping circuitry 208, the PPA improvement calculation circuitry 210, the cell management circuitry 212, the automation interface circuitry 200, and/or, more generally, the cell library analytics circuitry 116.

The processor circuitry 1212 of the illustrated example includes a local memory 1213 (e.g., a cache, registers, etc.). The processor circuitry 1212 of the illustrated example is in communication with a main memory including a volatile memory 1214 and a non-volatile memory 1216 by a bus 1218. The volatile memory 1214 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1216 may be implemented by flash memory and/or any other desired type of memory device. Access to the main memory 1214, 1216 of the illustrated example is controlled by a memory controller 1217.

The processor platform 1200 of the illustrated example also includes interface circuitry 1220. The interface circuitry 1220 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1222 are connected to the interface circuitry 1220. The input device(s) 1222 permit(s) a user to enter data and/or commands into the processor circuitry 1212. The input device(s) 1222 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1224 are also connected to the interface circuitry 1220 of the illustrated example. The output device(s) 1224 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1220 of the illustrated example, thus, typically includes a graphics driver card, a graphics driver chip, and/or graphics processor circuitry such as a GPU.

The interface circuitry 1220 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1226. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1200 of the illustrated example also includes one or more mass storage devices 1228 to store software and/or data. Examples of such mass storage devices 1228 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine readable instructions 1232, which may be implemented by the machine readable instructions of FIGS. 7-11, may be stored in the mass storage device 1228, in the volatile memory 1214, in the non-volatile memory 1216, and/or on a removable non-transitory computer readable storage medium such as a CD or DVD. In addition, one or more of the mass storage device 1228, the volatile memory 1214, the non-volatile memory 1216, and/or the local memory 1213 may implement the memory 106 of FIGS. 1 and 2.

Figure 13:
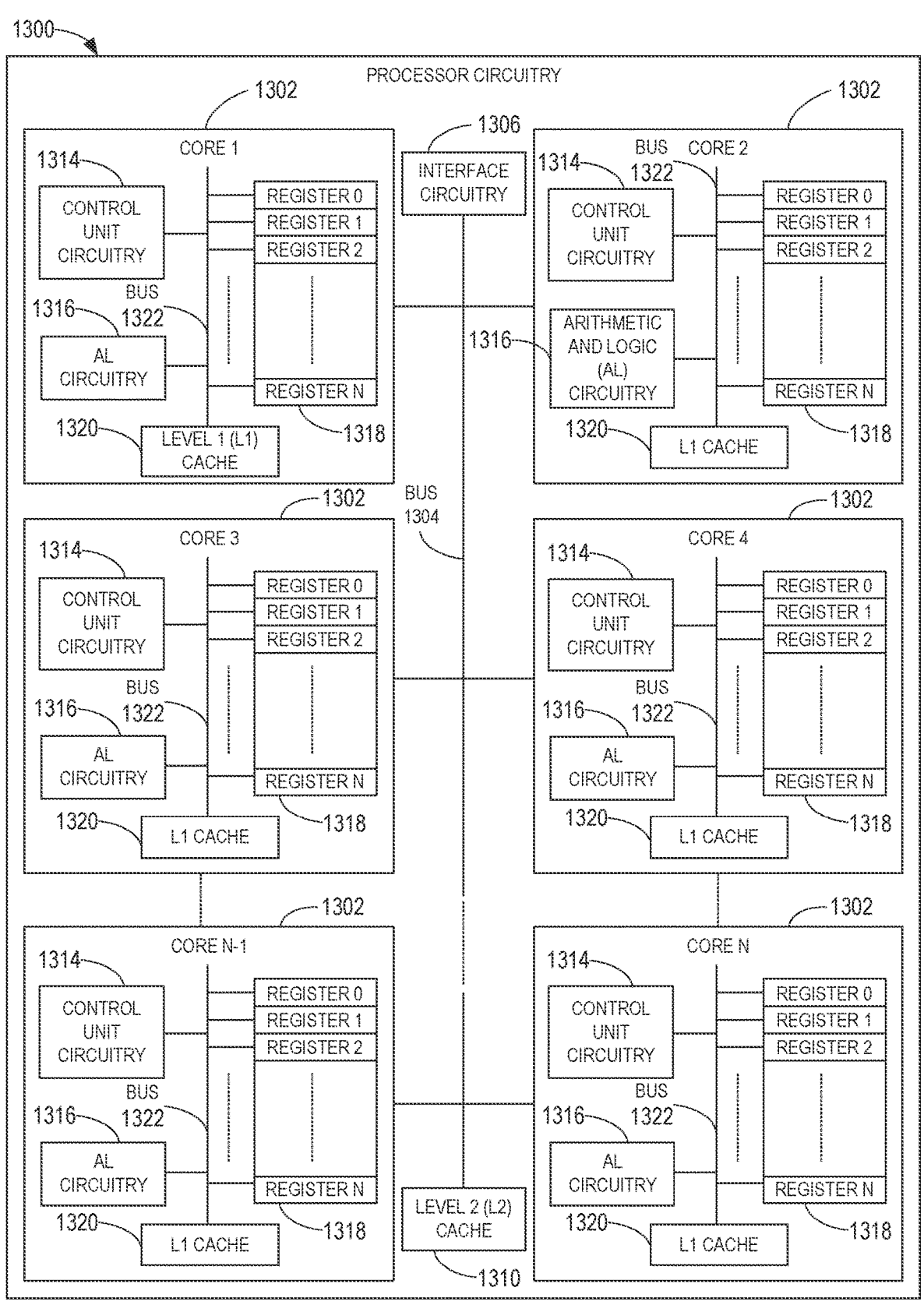
FIG. 13 is a block diagram of an example implementation of the processor circuitry of FIG. 12.

FIG. 13 is a block diagram of an example implementation of the processor circuitry 1212 of FIG. 12. In this example, the processor circuitry 1212 of FIG. 12 is implemented by a microprocessor 1300. For example, the microprocessor 1300 may be a general purpose microprocessor (e.g., general purpose microprocessor circuitry). The microprocessor 1300 executes some or all of the machine readable instructions of the flowcharts of FIGS. 7-11 to effectively instantiate the circuitry of FIG. 1 as logic circuits to perform the operations corresponding to those machine readable instructions. In some such examples, the circuitry of FIG. 1 is instantiated by the hardware circuits of the microprocessor 1300 in combination with the instructions. For example, the microprocessor 1300 may be implemented by multi-core hardware circuitry such as a CPU, a DSP, a GPU, an XPU, etc. Although it may include any number of example cores 1302 (e.g., 1 core), the microprocessor 1300 of this example is a multi-core semiconductor device including N cores. The cores 1302 of the microprocessor 1300 may operate independently or may cooperate to execute machine readable instructions. For example, machine code corresponding to a firmware program, an embedded software program, or a software program may be executed by one of the cores 1302 or may be executed by multiple ones of the cores 1302 at the same or different times. In some examples, the machine code corresponding to the firmware program, the embedded software program, or the software program is split into threads and executed in parallel by two or more of the cores 1302. The software program may correspond to a portion or all of the machine readable instructions and/or operations represented by the flowcharts of FIGS. 7-11.

The cores 1302 may communicate by a first example bus 1304. In some examples, the first bus 1304 may be implemented by a communication bus to effectuate communication associated with one(s) of the cores 1302. For example, the first bus 1304 may be implemented by at least one of an Inter-Integrated Circuit (I2C) bus, a Serial Peripheral Interface (SPI) bus, a PCI bus, or a PCIe bus. Additionally or alternatively, the first bus 1304 may be implemented by any other type of computing or electrical bus. The cores 1302 may obtain data, instructions, and/or signals from one or more external devices by example interface circuitry 1306. The cores 1302 may output data, instructions, and/or signals to the one or more external devices by the interface circuitry 1306. Although the cores 1302 of this example include example local memory 1320 (e.g., Level 1 (L1) cache that may be split into an L1 data cache and an L1 instruction cache), the microprocessor 1300 also includes example shared memory 1310 that may be shared by the cores (e.g., Level 2 (L2 cache)) for high-speed access to data and/or instructions. Data and/or instructions may be transferred (e.g., shared) by writing to and/or reading from the shared memory 1310. The local memory 1320 of each of the cores 1302 and the shared memory 1310 may be part of a hierarchy of storage devices including multiple levels of cache memory and the main memory (e.g., the main memory 1214, 1216 of FIG. 12). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1302 may be referred to as a CPU, DSP, GPU, etc., or any other type of hardware circuitry. Each core 1302 includes control unit circuitry 1314, arithmetic and logic (AL) circuitry (sometimes referred to as an ALU) 1316, a plurality of registers 1318, the local memory 1320, and a second example bus 1322. Other structures may be present. For example, each core 1302 may include vector unit circuitry, single instruction multiple data (SIMD) unit circuitry, load/store unit (LSU) circuitry, branch/jump unit circuitry, floating-point unit (FPU) circuitry, etc. The control unit circuitry 1314 includes semiconductor-based circuits structured to control (e.g., coordinate) data movement within the corresponding core 1302. The AL circuitry 1316 includes semiconductor-based circuits structured to perform one or more mathematic and/or logic operations on the data within the corresponding core 1302. The AL circuitry 1316 of some examples performs integer based operations. In other examples, the AL circuitry 1316 also performs floating point operations. In yet other examples, the AL circuitry 1316 may include first AL circuitry that performs integer based operations and second AL circuitry that performs floating point operations. In some examples, the AL circuitry 1316 may be referred to as an Arithmetic Logic Unit (ALU). The registers 1318 are semiconductor-based structures to store data and/or instructions such as results of one or more of the operations performed by the AL circuitry 1316 of the corresponding core 1302. For example, the registers 1318 may include vector register(s), SIMD register(s), general purpose register(s), flag register(s), segment register(s), machine specific register(s), instruction pointer register(s), control register(s), debug register(s), memory management register(s), machine check register(s), etc. The registers 1318 may be arranged in a bank as shown in FIG. 13. Alternatively, the registers 1318 may be organized in any other arrangement, format, or structure including distributed throughout the core 1302 to shorten access time. The second bus 1322 may be implemented by at least one of an I2C bus, a SPI bus, a PCI bus, or a PCIe bus Each core 1302 and/or, more generally, the microprocessor 1300 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1300 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 14:
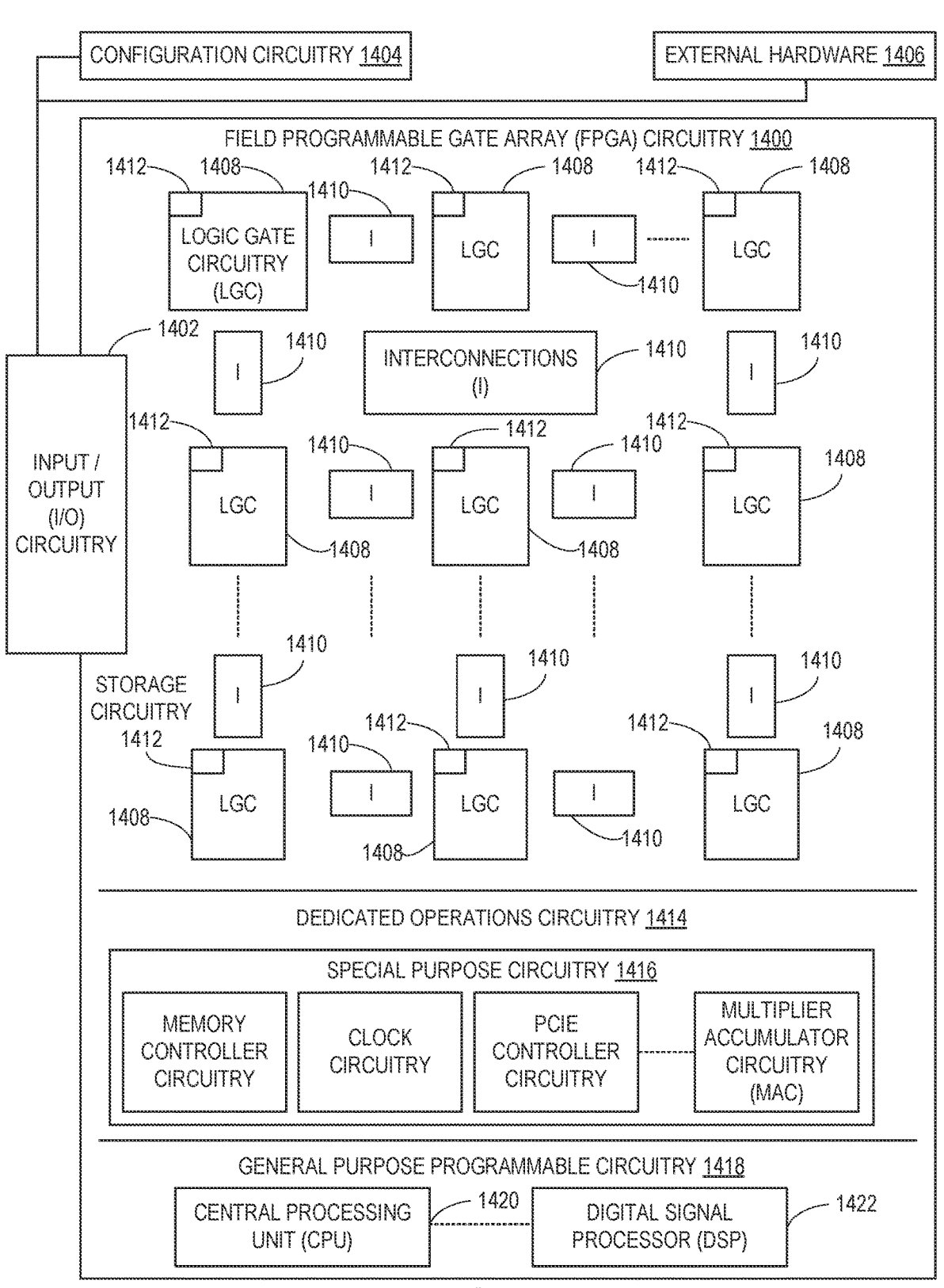
FIG. 14 is a block diagram of another example implementation of the processor circuitry of FIG. 12.

FIG. 14 is a block diagram of another example implementation of the processor circuitry 1212 of FIG. 12. In this example, the processor circuitry 1212 is implemented by FPGA circuitry 1400. For example, the FPGA circuitry 1400 may be implemented by an FPGA. The FPGA circuitry 1400 can be used, for example, to perform operations that could otherwise be performed by the example microprocessor 1300 of FIG. 13 executing corresponding machine readable instructions. However, once configured, the FPGA circuitry 1400 instantiates the machine readable instructions in hardware and, thus, can often execute the operations faster than they could be performed by a general purpose microprocessor executing the corresponding software.

More specifically, in contrast to the microprocessor 1300 of FIG. 13 described above (which is a general purpose device that may be programmed to execute some or all of the machine readable instructions represented by the flowcharts of FIGS. 7-11 but whose interconnections and logic circuitry are fixed once fabricated), the FPGA circuitry 1400 of the example of FIG. 14 includes interconnections and logic circuitry that may be configured and/or interconnected in different ways after fabrication to instantiate, for example, some or all of the machine readable instructions represented by the flowcharts of FIGS. 7-11. In particular, the FPGA circuitry 1400 may be thought of as an array of logic gates, interconnections, and switches. The switches can be programmed to change how the logic gates are interconnected by the interconnections, effectively forming one or more dedicated logic circuits (unless and until the FPGA circuitry 1400 is reprogrammed). The configured logic circuits enable the logic gates to cooperate in different ways to perform different operations on data received by input circuitry. Those operations may correspond to some or all of the software represented by the flowcharts of FIGS. 7-11. As such, the FPGA circuitry 1400 may be structured to effectively instantiate some or all of the machine readable instructions of the flowcharts of FIGS. 7-11 as dedicated logic circuits to perform the operations corresponding to those software instructions in a dedicated manner analogous to an ASIC. Therefore, the FPGA circuitry 1400 may perform the operations corresponding to the some or all of the machine readable instructions of FIGS. 7-11 faster than the general purpose microprocessor can execute the same.

In the example of FIG. 14, the FPGA circuitry 1400 is structured to be programmed (and/or reprogrammed one or more times) by an end user by a hardware description language (HDL) such as Verilog. The FPGA circuitry 1400 of FIG. 14, includes example input/output (I/O) circuitry 1402 to obtain and/or output data to/from example configuration circuitry 1404 and/or external hardware 1406. For example, the configuration circuitry 1404 may be implemented by interface circuitry that may obtain machine readable instructions to configure the FPGA circuitry 1400, or portion(s) thereof. In some such examples, the configuration circuitry 1404 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1406 may be implemented by external hardware circuitry. For example, the external hardware 1406 may be implemented by the microprocessor 1300 of FIG. 13. The FPGA circuitry 1400 also includes an array of example logic gate circuitry 1408, a plurality of example configurable interconnections 1410, and example storage circuitry 1412. The logic gate circuitry 1408 and the configurable interconnections 1410 are configurable to instantiate one or more operations that may correspond to at least some of the machine readable instructions of FIGS. 7-11 and/or other desired operations. The logic gate circuitry 1408 shown in FIG. 14 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1408 to enable configuration of the electrical structures and/or the logic gates to form circuits to perform desired operations. The logic gate circuitry 1408 may include other electrical structures such as look-up tables (LUTs), registers (e.g., flip-flops or latches), multiplexers, etc.

The configurable interconnections 1410 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1408 to program desired logic circuits.

The storage circuitry 1412 of the illustrated example is structured to store result(s) of the one or more of the operations performed by corresponding logic gates. The storage circuitry 1412 may be implemented by registers or the like. In the illustrated example, the storage circuitry 1412 is distributed amongst the logic gate circuitry 1408 to facilitate access and increase execution speed.

The example FPGA circuitry 1400 of FIG. 14 also includes example Dedicated Operations Circuitry 1414. In this example, the Dedicated Operations Circuitry 1414 includes special purpose circuitry 1416 that may be invoked to implement commonly used functions to avoid the need to program those functions in the field. Examples of such special purpose circuitry 1416 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1400 may also include example general purpose programmable circuitry 1418 such as an example CPU 1420 and/or an example DSP 1422. Other general purpose programmable circuitry 1418 may additionally or alternatively be present such as a GPU, an XPU, etc., that can be programmed to perform other operations.

Although FIGS. 13 and 14 illustrate two example implementations of the processor circuitry 1212 of FIG. 12, many other approaches are contemplated. For example, as mentioned above, modern FPGA circuitry may include an onboard CPU, such as one or more of the example CPU 1420 of FIG. 14. Therefore, the processor circuitry 1212 of FIG. 12 may additionally be implemented by combining the example microprocessor 1300 of FIG. 13 and the example FPGA circuitry 1400 of FIG. 14. In some such hybrid examples, a first portion of the machine readable instructions represented by the flowcharts of FIGS. 7-11 may be executed by one or more of the cores 1302 of FIG. 13, a second portion of the machine readable instructions represented by the flowcharts of FIGS. 7-11 may be executed by the FPGA circuitry 1400 of FIG. 14, and/or a third portion of the machine readable instructions represented by the flowcharts of FIGS. 7-11 may be executed by an ASIC. It should be understood that some or all of the circuitry of FIG. 1 may, thus, be instantiated at the same or different times. Some or all of the circuitry may be instantiated, for example, in one or more threads executing concurrently and/or in series. Moreover, in some examples, some or all of the circuitry of FIG. 1 may be implemented within one or more virtual machines and/or containers executing on the microprocessor.

In some examples, the processor circuitry 1212 of FIG. 12 may be in one or more packages. For example, the microprocessor 1300 of FIG. 13 and/or the FPGA circuitry 1400 of FIG. 14 may be in one or more packages. In some examples, an XPU may be implemented by the processor circuitry 1212 of FIG. 12, which may be in one or more packages. For example, the XPU may include a CPU in one package, a DSP in another package, a GPU in yet another package, and an FPGA in still yet another package.

Figure 15:
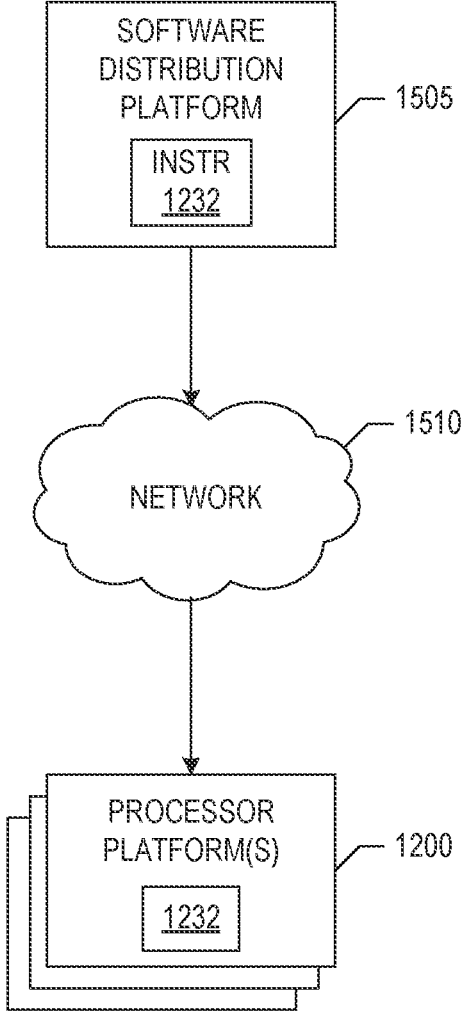
FIG. 15 is a block diagram of an example software distribution platform (e.g., one or more servers) to distribute software (e.g., software corresponding to the example machine readable instructions of FIGS. 7-11) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 1505 to distribute software such as the example machine readable instructions 1232 of FIG. 12 to hardware devices owned and/or operated by third parties is illustrated in FIG. 15. The example software distribution platform 1505 may be implemented by any computer server, data facility, cloud service, etc., capable of storing and transmitting software to other computing devices. The third parties may be customers of the entity owning and/or operating the software distribution platform 1505. For example, the entity that owns and/or operates the software distribution platform 1505 may be a developer, a seller, and/or a licensor of software such as the example machine readable instructions 1232 of FIG. 12. The third parties may be consumers, users, retailers, OEMs, etc., who purchase and/or license the software for use and/or re-sale and/or sub-licensing. In the illustrated example, the software distribution platform 1505 includes one or more servers and one or more storage devices. The storage devices store the machine readable instructions 1232, which may correspond to the example machine readable instructions 700, 1100, etc. of FIGS. 7-11, as described above. The one or more servers of the example software distribution platform 1505 are in communication with an example network 1510, which may correspond to any one or more of the Internet and/or any of the example networks described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 1232 from the software distribution platform 1505. For example, the software, which may correspond to the example machine readable instructions 700, 1100, etc. of FIGS. 7-11, may be downloaded to the example processor platform 1200, which is to execute the machine readable instructions 1232 to implement the cell library analytics circuitry 116 of FIG. 1. In some examples, one or more servers of the software distribution platform 1505 periodically offer, transmit, and/or force updates to the software (e.g., the example machine readable instructions 1232 of FIG. 12) to ensure improvements, patches, updates, etc., are distributed and applied to the software at the end user devices.

From the foregoing, it will be appreciated that example systems, methods, apparatus, and articles of manufacture have been disclosed that implement library analytics and guided partitioning for efficient power-performance-area of semiconductor chip design. Disclosed systems, methods, apparatus, and articles of manufacture may be used to improve the efficiency of using a computing device by decreasing the size of a cell library for use by a computer-implemented circuit design automation interface. In decreasing the size of the cell library, the automation that performs the circuit design has less compute resource requirements and the PPA of such circuit designs can improve as well. Disclosed systems, methods, apparatus, and articles of manufacture are accordingly directed to one or more improvement(s) in the operation of a machine such as a computer or other electronic and/or mechanical device.

Further examples and combinations thereof include the following:

Example 1 includes a system, comprising at least one memory, programmable circuitry, and instructions stored in the at least one memory to cause the programmable circuitry to determine a design block associated with a design exception, parse the design block into a functional netlist of cell families, generate a cell occurrence counts distribution based on ones of the cell families from the functional netlist, group the ones of the cell families corresponding to the cell occurrence counts distribution into ones of cell family bins, the ones of the cell family bins corresponding to at least one value of a fabrication parameter, determine inclusion of a first cell family bin of the ones of the cell family bins in the functional netlist does not improve first one or more process technology attribute values compared to second one or more process technology attribute values, the second one or more process technology attribute values corresponding to when the first cell family bin is removed from the functional netlist, and cause a user interface to indicate the first cell family bin as a cell family bin candidate for removal from the functional netlist.

Example 2 includes the system of example 1, wherein to generate the cell occurrence counts distribution based on the ones of the cell families from the functional netlist includes to start with a first cell family with a highest occurrence count among the ones of the cell families and add second occurrence counts of the ones of cell families in a decreasing occurrence count order until a selection threshold cumulative percentage of total cell families in the functional netlist is satisfied.

Example 3 includes the system of example 1, wherein the programmable circuitry is to determine inclusion of a first cell family of the ones of cell families in the functional netlist does not improve the first one or more process technology attribute values across at least a plurality of fabrication parameters compared to the second one or more process technology attribute values when the first cell family is removed from the functional netlist, and cause the user interface to indicate the first cell family in the user interface as a cell family candidate for removal from the functional netlist.

Example 4 includes the system of example 1, wherein at least one of the ones of cell family bins includes cell families with approximately adjacent fabrication parameter values.

Example 5 includes the system of example 4, wherein the cell occurrence counts distribution of the ones of cell families includes a substantially normal distribution.

Example 6 includes the system of example 1, wherein the programmable circuitry is to concatenate a plurality of the ones of the cell family bins, including an anchor cell family bin with one or more cells of a first fabrication parameter value and at least one adjacent cell family bin with zero cells of the first fabrication parameter value.

Example 7 includes the system of example 1, wherein the design block is a first design block, the at least one of the one or more process technology attribute values is an average process technology attribute value calculated over a plurality of design blocks, the plurality of design blocks including the first design block.

Example 8 includes the system of example 1, wherein the fabrication parameter includes one of drive strength or threshold voltage.

Example 9 includes the system of example 1, wherein the programmable circuitry is to initiate a removal matrix for the fabrication parameter, a first dimension of the removal matrix representing the ones of the cell families, a second dimension of the removal matrix representing the ones of the cell family bins, and cause the user interface to indicate potential removal of a row or a column in the removal matrix, the row or the column representing a removal candidate cell family of the ones of the cell families or representing a removal candidate cell family bin of the ones of the cell family bins.

Example 10 includes the system of example 9, wherein the fabrication parameter is a first fabrication parameter, the removal matrix to include a third dimension representing ones of fabrication parameters, the ones of the fabrication parameters including the first fabrication parameter.

Example 11 includes a non-transitory machine readable storage medium comprising instructions that, when executed, cause processor circuitry to at least determine a design block associated with a design exception, parse the design block into a functional netlist of cell families, generate a cell occurrence counts distribution based on ones of the cell families from the functional netlist, group the ones of the cell families corresponding to the cell occurrence counts distribution into ones of cell family bins, the ones of the cell family bins corresponding to at least one value of a fabrication parameter, determine inclusion of a first cell family bin of the ones of the cell family bins in the functional netlist does not improve first one or more process technology attribute values compared to second one or more process technology attribute values, the second one or more process technology attribute values corresponding to when the first cell family bin is removed from the functional netlist, and cause a user interface to indicate the first cell family bin as a cell family bin candidate for removal from the functional netlist.

Example 12 includes the non-transitory machine readable storage medium of example 11, wherein to generate the cell occurrence counts distribution based on the ones of the cell families from the functional netlist includes to start with a first cell family with a highest occurrence count among the ones of the cell families and add second occurrence counts of the ones of cell families in a decreasing occurrence count order until a selection threshold cumulative percentage of total cell families in the functional netlist is satisfied.

Example 13 includes the non-transitory machine readable storage medium of example 11, wherein the instructions, when executed, cause processor circuitry to at least determine inclusion of a first cell family of the ones of cell families in the functional netlist does not improve the first one or more process technology attribute values across at least a plurality of fabrication parameters compared to the second one or more process technology attribute values when the first cell family is removed from the functional netlist, and cause the user interface to indicate the first cell family in the user interface as a cell family candidate for removal from the functional netlist.

Example 14 includes the non-transitory machine readable storage medium of example 11, wherein at least one of the ones of cell family bins includes cell families with approximately adjacent fabrication parameter values.

Example 15 includes the non-transitory machine readable storage medium of example 11, wherein the cell occurrence counts distribution of the ones of cell families includes a substantially normal distribution.

Example 16 includes the non-transitory machine readable storage medium of example 11, wherein the instructions, when executed, cause processor circuitry to at least concatenate a plurality of the ones of the cell family bins, including an anchor cell family bin with one or more cells of a first fabrication parameter value and at least one adjacent cell family bin with zero cells of the first fabrication parameter value.

Example 17 includes the non-transitory machine readable storage medium of example 11, wherein the design block is a first design block, the at least one of the one or more process technology attribute values is an average process technology attribute value calculated over a plurality of design blocks, the plurality of design blocks including the first design block.

Example 18 includes the non-transitory machine readable storage medium of example 11, wherein the fabrication parameter includes one of drive strength or threshold voltage.

Example 19 includes the non-transitory machine readable storage medium of example 11, wherein the instructions, when executed, cause processor circuitry to at least initiate a removal matrix for the fabrication parameter, a first dimension of the removal matrix representing the ones of the cell families, a second dimension of the removal matrix representing the ones of the cell family bins, and cause the user interface to indicate potential removal of a row or a column in the removal matrix, the row or the column representing a removal candidate cell family of the ones of the cell families or representing a removal candidate cell family bin of the ones of the cell family bins.

Example 20 includes the non-transitory machine readable storage medium of example 19, wherein the fabrication parameter is a first fabrication parameter, the removal matrix to include a third dimension representing ones of fabrication parameters, the ones of the fabrication parameters including the first fabrication parameter.

Example 21 includes a method comprising determining a design block associated with a design exception, parsing the design block into a functional netlist of cell families, generating a cell occurrence counts distribution based on ones of the cell families from the functional netlist, grouping the ones of the cell families corresponding to the cell occurrence counts distribution into ones of cell family bins, the ones of the cell family bins corresponding to at least one value of a fabrication parameter, determining inclusion of a first cell family bin of the ones of the cell family bins in the functional netlist does not improve first one or more process technology attribute values compared to second one or more process technology attribute values, the second one or more process technology attribute values corresponding to when the first cell family bin is removed from the functional netlist, and causing a user interface to indicate the first cell family bin as a cell family bin candidate for removal from the functional netlist.

Example 22 includes the method of example 21, wherein generating the cell occurrence counts distribution based on the ones of the cell families from the functional netlist includes starting with a first cell family with a highest occurrence count among the ones of the cell families and add second occurrence counts of the ones of cell families in a decreasing occurrence count order until a selection threshold cumulative percentage of total cell families in the functional netlist is satisfied.

Example 23 includes the method of example 21, including determining inclusion of a first cell family of the ones of cell families in the functional netlist does not improve the first one or more process technology attribute values across at least a plurality of fabrication parameters compared to the second one or more process technology attribute values when the first cell family is removed from the functional netlist, and causing the user interface to indicate the first cell family in the user interface as a cell family candidate for removal from the functional netlist.

Example 24 includes the method of example 21, wherein at least one of the ones of cell family bins includes cell families with approximately adjacent fabrication parameter values.

Example 25 includes the method of example 21, wherein the cell occurrence counts distribution of the ones of cell families includes a substantially normal distribution.

Example 26 includes the method of example 21, including concatenating a plurality of the ones of the cell family bins, including an anchor cell family bin with one or more cells of a first fabrication parameter value and at least one adjacent cell family bin with zero cells of the first fabrication parameter value.

Example 27 includes the method of example 21, wherein the design block is a first design block, the at least one of the one or more process technology attribute values is an average process technology attribute value calculated over a plurality of design blocks, the plurality of design blocks including the first design block.

Example 28 includes the method of example 21, wherein the fabrication parameter includes one of drive strength or threshold voltage.

Example 29 includes the method of example 21, including initiating a removal matrix for the fabrication parameter, a first dimension of the removal matrix representing the ones of the cell families, a second dimension of the removal matrix representing the ones of the cell family bins, and causing the user interface to indicate potential removal of a row or a column in the removal matrix, the row or the column representing a removal candidate cell family of the ones of the cell families or representing a removal candidate cell family bin of the ones of the cell family bins.

Example 30 includes the method of example 29, wherein the fabrication parameter is a first fabrication parameter, the removal matrix to include a third dimension representing ones of fabrication parameters, the ones of the fabrication parameters including the first fabrication parameter.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A system, comprising:
at least one memory;
programmable circuitry; and
instructions stored in the at least one memory to cause the programmable circuitry to:
determine a design block associated with a design exception;
parse the design block into a functional netlist of cell families;
generate a cell occurrence counts distribution based on ones of the cell families from the functional netlist;
group the ones of the cell families corresponding to the cell occurrence counts distribution into ones of cell family bins, the ones of the cell family bins corresponding to at least one value of a fabrication parameter;
determine inclusion of a first cell family bin of the ones of the cell family bins in the functional netlist does not improve first one or more process technology attribute values compared to second one or more process technology attribute values, the second one or more process technology attribute values corresponding to when the first cell family bin is removed from the functional netlist; and
cause a user interface to indicate the first cell family bin as a cell family bin candidate for removal from the functional netlist.

2. The system of claim 1, wherein the programmable circuitry is to generate the cell occurrence counts distribution based on the ones of the cell families from the functional netlist by:
starting with a first cell family with a highest occurrence count among the ones of the cell families; and
adding second occurrence counts of the ones of cell families in a decreasing occurrence count order until a selection threshold cumulative percentage of total cell families in the functional netlist is satisfied.

3. The system of claim 1, wherein the programmable circuitry is to:
determine inclusion of a first cell family of the ones of cell families in the functional netlist does not improve the first one or more process technology attribute values across at least a plurality of fabrication parameters compared to the second one or more process technology attribute values when the first cell family is removed from the functional netlist; and
cause the user interface to indicate the first cell family in the user interface as a cell family candidate for removal from the functional netlist.

4. The system of claim 1, wherein at least one of the ones of cell family bins includes cell families with approximately adjacent fabrication parameter values.

5. The system of claim 4, wherein the cell occurrence counts distribution of the ones of cell families includes a substantially normal distribution.

6. The system of claim 1, wherein the programmable circuitry is to:
concatenate a plurality of the ones of the cell family bins, including an anchor cell family bin with one or more cells of a first fabrication parameter value and at least one adjacent cell family bin with zero cells of the first fabrication parameter value.

7. The system of claim 1, wherein the design block is a first design block, the at least one of the one or more process technology attribute values is an average process technology attribute value calculated over a plurality of design blocks, the plurality of design blocks including the first design block.

8. The system of claim 1, wherein the fabrication parameter includes one of drive strength or threshold voltage.

9. The system of claim 1, wherein the programmable circuitry is to:
initiate a removal matrix for the fabrication parameter, a first dimension of the removal matrix representing the ones of the cell families, a second dimension of the removal matrix representing the ones of the cell family bins; and
cause the user interface to indicate potential removal of a row or a column in the removal matrix, the row or the column representing a removal candidate cell family of the ones of the cell families or representing a removal candidate cell family bin of the ones of the cell family bins.

10. The system of claim 9, wherein the fabrication parameter is a first fabrication parameter, the removal matrix to include a third dimension representing ones of fabrication parameters, the ones of the fabrication parameters including the first fabrication parameter.

11. A non-transitory machine readable storage medium comprising instructions that cause processor circuitry to at least:

determine a design block associated with a design exception;

parse the design block into a functional netlist of cell families;

generate a cell occurrence counts distribution based on ones of the cell families from the functional netlist;

group the ones of the cell families corresponding to the cell occurrence counts distribution into ones of cell family bins, the ones of the cell family bins corresponding to at least one value of a fabrication parameter;

determine inclusion of a first cell family bin of the ones of the cell family bins in the functional netlist does not improve first one or more process technology attribute values compared to second one or more process technology attribute values, the second one or more process technology attribute values corresponding to when the first cell family bin is removed from the functional netlist; and cause a user interface to indicate the first cell family bin as a cell family bin candidate for removal from the functional netlist.

12. The non-transitory machine readable storage medium of claim 11, wherein the instructions cause the processor circuitry to generate the cell occurrence counts distribution based on the ones of the cell families from the functional netlist by causing the processor ciruitry to:

start with a first cell family with a highest occurrence count among the ones of the cell families; and add second occurrence counts of the ones of cell families in a decreasing occurrence count order until a selection threshold cumulative percentage of total cell families in the functional netlist is satisfied.

13. The non-transitory machine readable storage medium of claim 11, wherein the instructions cause the processor circuitry to at least:

determine inclusion of a first cell family of the ones of cell families in the functional netlist does not improve the first one or more process technology attribute values across at least a plurality of fabrication parameters compared to the second one or more process technology attribute values when the first cell family is removed from the functional netlist; and cause the user interface to indicate the first cell family in the user interface as a cell family candidate for removal from the functional netlist.

14. The non-transitory machine readable storage medium of claim 11, wherein at least one of the ones of cell family bins includes cell families with approximately adjacent fabrication parameter values.

15. The non-transitory machine readable storage medium of claim 11, wherein the cell occurrence counts distribution of the ones of cell families includes a substantially normal distribution.

16. The non-transitory machine readable storage medium of claim 11, wherein the instructions cause the processor circuitry to at least:

concatenate a plurality of the ones of the cell family bins, including an anchor cell family bin with one or more cells of a first fabrication parameter value and at least one adjacent cell family bin with zero cells of the first fabrication parameter value.

17. The non-transitory machine readable storage medium of claim 11, wherein the design block is a first design block, the at least one of the one or more process technology attribute values is an average process technology attribute value calculated over a plurality of design blocks, the plurality of design blocks including the first design block.

18. The non-transitory machine readable storage medium of claim 11, wherein the fabrication parameter includes one of drive strength or threshold voltage.

19. The non-transitory machine readable storage medium of claim 11, wherein the instructions cause the processor circuitry to at least:

initiate a removal matrix for the fabrication parameter, a first dimension of the removal matrix representing the ones of the cell families, a second dimension of the removal matrix representing the ones of the cell family bins; and cause the user interface to indicate potential removal of a row or a column in the removal matrix, the row or the column representing a removal candidate cell family of the ones of the cell families or representing a removal candidate cell family bin of the ones of the cell family bins.

20. The non-transitory machine readable storage medium of claim 19, wherein the fabrication parameter is a first fabrication parameter, the removal matrix to include a third dimension representing ones of fabrication parameters, the ones of the fabrication parameters including the first fabrication parameter.

21. A method comprising:

determining a design block associated with a design exception;

parsing the design block into a functional netlist of cell families;

generating a cell occurrence counts distribution based on ones of the cell families from the functional netlist;

grouping the ones of the cell families corresponding to the cell occurrence counts distribution into ones of cell family bins, the ones of the cell family bins corresponding to at least one value of a fabrication parameter;

determining inclusion of a first cell family bin of the ones of the cell family bins in the functional netlist does not improve first one or more process technology attribute values compared to second one or more process technology attribute values, the second one or more process technology attribute values corresponding to when the first cell family bin is removed from the functional netlist; and causing a user interface to indicate the first cell family bin as a cell family bin candidate for removal from the functional netlist.

22. The method of claim 21, wherein the generating of the cell occurrence counts distribution based on the ones of the cell families from the functional netlist includes:

starting with a first cell family with a highest occurrence count among the ones of the cell families; and adding second occurrence counts of the ones of cell families in a decreasing occurrence count order until a selection threshold cumulative percentage of total cell families in the functional netlist is satisfied.

23. The method of claim 21, including:

determining inclusion of a first cell family of the ones of cell families in the functional netlist does not improve the first one or more process technology attribute values across at least a plurality of fabrication parameters compared to the second one or more process technology attribute values when the first cell family is removed from the functional netlist; and causing the user interface to indicate the first cell family in the user interface as a cell family candidate for removal from the functional netlist.

24. The method of claim 21, wherein at least one of the ones of cell family bins includes cell families with approximately adjacent fabrication parameter values.

25. The method of claim 21, wherein the cell occurrence counts distribution of the ones of cell families includes a substantially normal distribution.

26. The method of claim 21, including:

concatenating a plurality of the ones of the cell family bins, including an anchor cell family bin with one or more cells of a first fabrication parameter value and at least one adjacent cell family bin with zero cells of the first fabrication parameter value.

27. The method of claim 21, wherein the design block is a first design block, the at least one of the one or more process technology attribute values is an average process technology attribute value calculated over a plurality of design blocks, the plurality of design blocks including the first design block.

28. The method of claim 21, wherein the fabrication parameter includes one of drive strength or threshold voltage.

29. The method of claim 21, including:

initiating a removal matrix for the fabrication parameter, a first dimension of the removal matrix representing the ones of the cell families, a second dimension of the removal matrix representing the ones of the cell family bins; and causing the user interface to indicate potential removal of a row or a column in the removal matrix, the row or the column representing a removal candidate cell family of the ones of the cell families or representing a removal candidate cell family bin of the ones of the cell family bins.

30. The method of claim 29, wherein the fabrication parameter is a first fabrication parameter, the removal matrix to include a third dimension representing ones of fabrication parameters, the ones of the fabrication parameters including the first fabrication parameter.

\* \* \* \* \*